(12) United States Patent
Funane et al.

(10) Patent No.: US 10,224,095 B2
(45) Date of Patent: *Mar. 5, 2019

(54) SEMICONDUCTOR DEVICE HAVING MULTIPORT MEMORY

(71) Applicant: RENESAS ELECTRONICS CORPORATION, Tokyo (JP)

(72) Inventors: Kiyotada Funane, Nanae (JP); Ken Shibata, Nanae (JP); Yasuhisa Shimazaki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/795,502

(22) Filed: Oct. 27, 2017

(65) Prior Publication Data

US 2018/0068710 A1    Mar. 8, 2018

Related U.S. Application Data

(63) Continuation of application No. 15/583,093, filed on May 1, 2017, now Pat. No. 9,830,975, which is a (Continued)

(30) Foreign Application Priority Data

Aug. 31, 2007    (JP) .................. 2007-226451

(51) Int. Cl.
*G11C 5/02* (2006.01)
*G11C 11/417* (2006.01)
(Continued)

(52) U.S. Cl.
CPC .............. *G11C 11/417* (2013.01); *G11C 5/02* (2013.01); *G11C 5/06* (2013.01); *G11C 7/1075* (2013.01);
(Continued)

(58) Field of Classification Search
CPC ....... G11C 11/417; G11C 5/02; G11C 7/1075; G11C 8/16; G11C 11/412
See application file for complete search history.

(56) References Cited

U.S. PATENT DOCUMENTS 5,966,317 A    10/1999    O'Connor
6,469,328 B2    10/2002    Yanai et al.
(Continued)

FOREIGN PATENT DOCUMENTS

JP    2000-133724 A    5/2000
JP    2000-236029 A    8/2000
(Continued)

OTHER PUBLICATIONS

Korean Office Action received in corresponding Korean Application No. 10-2008-0085479 dated Nov. 28, 2014.

*Primary Examiner* — Toan K Le
(74) *Attorney, Agent, or Firm* — Mattingly & Malur, PC

(57) ABSTRACT

A semiconductor device enabling expansion of a noise margin. For example, in a memory area in which each memory cell MC is coupled to a word line WLA for a first port and a word line WLB for a second port, and a plurality of memory cells MC are disposed in a matrix shape, each word line is disposed in the order of WLA0, WLB0, WLB1, WLA1, WLA2. Further, a pitch d2 between WLA-WLA and between WLB-WLB is made smaller than a pitch d1 between WLA-WLB. As such, the word lines of an identical port are disposed at the pitch d2 on one of both sides of a certain word line and the word lines of different ports are disposed at the pitch d1 on the other.

8 Claims, 22 Drawing Sheets

Related U.S. Application Data continuation of application No. 15/190,263, filed on Jun. 23, 2016, now Pat. No. 9,672,872, which is a continuation of application No. 14/490,235, filed on Sep. 18, 2014, now Pat. No. 9,378,773, which is a continuation of application No. 13/900,127, filed on May 22, 2013, now Pat. No. 8,867,253, which is a continuation of application No. 13/455,541, filed on Apr. 25, 2012, now Pat. No. 8,467,214, which is a continuation of application No. 13/080,991, filed on Apr. 6, 2011, now Pat. No. 8,189,358, which is a continuation of application No. 12/144,051, filed on Jun. 23, 2008, now Pat. No. 7,940,542.

(51) Int. Cl.

| | | |
|---|---|---|
| *G11C 7/10* | (2006.01) | |
| *G11C 8/16* | (2006.01) | |
| *G11C 11/412* | (2006.01) | |
| *G11C 11/413* | (2006.01) | |
| *H01L 27/02* | (2006.01) | |
| *H01L 27/11* | (2006.01) | |
| *G11C 5/06* | (2006.01) | |

(52) U.S. Cl.
CPC .............. *G11C 8/16* (2013.01); *G11C 11/412* (2013.01); *G11C 11/413* (2013.01); *H01L 27/0207* (2013.01); *H01L 27/11* (2013.01); *H01L 27/1104* (2013.01)

(56) References Cited

U.S. PATENT DOCUMENTS

| | | | |
|---|---|---|---|
| 6,606,276 B2 | 8/2003 | Yamauchi et al. | |
| 6,636,207 B2 | 10/2003 | Matsuyama | |
| 6,754,849 B2 | 6/2004 | Tamura | |
| 6,804,153 B2 | 10/2004 | Yoshizawa | |
| 6,917,560 B2 | 7/2005 | Nii | |
| 7,110,318 B2 | 9/2006 | Nii | |
| 7,254,088 B2 | 8/2007 | Kurumada et al. | |
| 7,411,860 B2 | 8/2008 | Nii | |
| 7,447,059 B2 | 11/2008 | Uematsu | |
| 7,602,654 B2 | 10/2009 | Yabuuchi et al. | |
| 7,940,542 B2 | 5/2011 | Funane et al. | |
| 8,189,358 B2 | 5/2012 | Funane et al. | |
| 8,467,214 B2 | 6/2013 | Funane et al. | |
| 8,867,253 B2 | 10/2014 | Funane et al. | |
| 9,378,773 B2 | 6/2016 | Funane et al. | |
| 9,672,872 B2 * | 6/2017 | Funane | .................... G11C 8/16 |
| 9,830,975 B2 * | 11/2017 | Funane | ................. G11C 11/417 |
| 2001/0050380 A1 | 12/2001 | Yanai et al. | |
| 2002/0100920 A1 | 8/2002 | Yamauchi et al. | |
| 2004/0037107 A1 | 2/2004 | Matsuoka | |
| 2004/0111571 A1 | 6/2004 | Nii | |
| 2005/0201185 A1 | 9/2005 | Nii | |
| 2006/0092680 A1 | 5/2006 | Nii | |
| 2006/0092749 A1 | 5/2006 | Wong | |
| 2006/0126420 A1 | 6/2006 | Kurumada et al. | |
| 2008/0019171 A1 | 1/2008 | Liaw | |

FOREIGN PATENT DOCUMENTS

| | | |
|---|---|---|
| JP | 2002-009176 A | 1/2002 |
| JP | 2002-197866 A | 7/2002 |
| JP | 2002-222874 A | 8/2002 |
| JP | 2002-267721 A | 9/2002 |
| JP | 2004-86970 A | 3/2004 |
| JP | 2004-335535 A | 11/2004 |
| JP | 2006-134379 A | 5/2006 |

* cited by examiner

SEMICONDUCTOR DEVICE HAVING MULTIPORT MEMORY

CROSS-REFERENCE TO RELATED APPLICATION

This application is a continuation of U.S. patent application Ser. No. 15/583,093, filed May 1, 2017, which is a continuation of U.S. patent application Ser. No. 15/190,263, filed Jun. 23, 2016, now U.S. Pat. No. 9,672,872, which is a continuation of U.S. patent application Ser. No. 14/490,235, filed Sep. 18, 2014, now U.S. Pat. No. 9,378,773, which is a continuation of U.S. patent application Ser. No. 13/900,127, filed May 22, 2013, now U.S. Pat. No. 8,867,253, which is a continuation of U.S. patent application Ser. No. 13/455,541, filed Apr. 25, 2012, now U.S. Pat. No. 8,467,214, which is a continuation of U.S. patent application Ser. No. 13/080,991, filed Apr. 6, 2011, now U.S. Pat. No. 8,189,358, which is a continuation of U.S. patent application Ser. No. 12/144,051, filed Jun. 23, 2008, now U.S. Pat. No. 7,940,542, which claims priority to Japanese Patent Application No. 2007-226451, filed Aug. 31, 2007, the content of which is incorporated herein by reference in its entirety.

BACKGROUND OF THE INVENTION

The present invention relates to a semiconductor device, and more particularly to a technique which is useful when applied to a semiconductor device such as a multiport SRAM (Static Random Access Memory).

As an example, in Japanese Unexamined Patent Publication No. 2004-335535 (hereafter referred to as Patent Document 1), there is described a multiport memory of SRAM configuration having a layout such that a word line corresponding to a first port and a word line corresponding to a second port are disposed alternately. According to the above configuration, noise can be reduced without increasing a memory cell area because it is possible to avoid such a situation that coupling noise is simultaneously induced to a word line from the word lines disposed on both sides of the word line concerned.

Also, in Japanese Unexamined Patent Publication No. 2004-86970 (hereafter referred to as Patent Document 2), in regard to a bit line A for port A and a bit line B for port B coupled to a dual port DRAM cell, there is described a dual port DRAM configured to have timing to amplify the bit line A different from timing to amplify the bit line B. According to the above configuration, it is possible to prevent crosstalk noise between adjacent bit lines, even when the bit line A and the bit line B are disposed alternately in an open bit structure. Additionally, in regard to word lines, there is shown a configuration having a word line for port A alternately disposed with a word line for port B.

Further, according to Japanese Unexamined Patent Publication No. 2002-197866 (hereafter referred to as Patent Document 3), in a three-port RAM having two pairs of bit lines and a readout line for display being coupled to an SRAM memory cell, there is shown a configuration in which the readout line for display is disposed between either one pair out of the two pairs of bit lines. With the above configuration, it is possible to cancel noise in the readout line for display because complementary coupling noise is induced from the bit lines on both sides of the above readout line. Additionally, in regard to word lines, there is shown a configuration in which a word line for a first port, a word line for a second port and a word line for display readout are repetitively disposed in that order.

FIG. 20 shows a circuit diagram of an exemplary configuration of a multiport memory having been studied as a premise of the present invention. The multiport memory shown in FIG. 20 has a configuration as described in Patent Document 1 and Patent Document 2, in which a word line WLA for port A and a word line WLB for port B are disposed alternately at a pitch d4 which is kept equal between WLA and WLB. Using such the configuration, as described in Patent Document 1, when attention is directed to a word line WLB2 as an example, the word lines WLA1, WLA2 disposed on both sides of WLB2 do not simultaneously rise, and therefore it is possible to reduce coupling noise induced on WLB2.

However, from a different point of view, the exemplary configuration shown in FIG. 20 is configured to have a word line WLA (or WLB) for port A (or port B) sandwiched by word lines WLB (or WLA) for port B (or port A), and therefore, there is a possible problem caused by interference between different ports. FIG. 21 shows an explanatory diagram illustrating one example of operation waveforms between different ports and in an identical port. FIG. 22 shows an explanatory diagram illustrating one example of a trouble due to interference between ports.

In the multiport memory, normally, different ports are operated asynchronously. Therefore, as shown in FIG. 21, mutually neighboring word lines for a first port (port A) and for a second port (port B) as an example may be activated or deactivated at arbitrary timing in an identical cycle. If the above situation occurs, as shown in FIG. 22 for example, when the activation timing of the word line for the first port and the deactivation timing of the word line for the second port coincides, a delay may possibly be produced in the rise time (or fall time) of the waveform because of mutually affecting interference. On the other hand, as shown in FIG. 21, such the problem does not occur because mutually neighboring word lines of an identical port (the first port here) are not activated or deactivated simultaneously. Although the word line is taken as an example in the above description, the similar problem accompanying asynchronous operation may occur in regard to mutually neighboring bit lines for different ports, and in regard to other signal lines also.

Further, as described in Patent Document 1 etc., when there are mutually neighboring word lines for an identical port, it is necessary to consider about an influence of coupling noise given from one word line to the other, needless to say. However, in principle, the signals (word lines, bit lines and signal lines) for an identical port are never activated or deactivated simultaneously in an identical cycle, as illustrated in FIG. 21. Therefore, in the practical design, it is possible to sufficiently predict the degree of influence thereof, and it is possible to easily secure a necessary noise margin by the design. On the other hand, in regard to signals for different ports, activation and deactivation are made mutually asynchronously and at arbitrary timing (in other words, there are infinite number of combinations in the phase relation between the first port signals and the second port signals in the example shown in FIG. 21), and therefore, it is difficult to sufficiently predict the degree of mutual interference. Accordingly, in the case of signals for different ports, it is desirable to secure a relatively larger noise margin, as compared with the case of signals for an identical port.

SUMMARY OF THE INVENTION

The present invention has been made in view of the above circumstances, and has an object to provide a semiconductor device enabling extension of a noise margin. The above and further objects and novel features of the present invention will become more apparent from the description in the present specification and the accompanying drawings.

The semiconductor device according to one embodiment of the present invention includes a first word line for a first port and a second word line for a second port respectively included in each row; a first bit line for the first port and a second bit line for the second port respectively included in each row; and a plurality of memory cells disposed at the intersection between each row and each column. Further, in the above configuration, the first word line of a certain row is disposed adjacent to the first word line of a neighboring row thereof at a second pitch, and the second word line of a certain row is disposed adjacent to the second word line of a neighboring row thereof at the second pitch, and as a feature, a pitch between the first word line and the second word line in each row is larger than the second pitch.

With this, it is possible to reduce interference between different ports, and to achieve an expanded noise margin. Also, as compared with an exemplary case of alternate disposition of a first word line and a second word line, the expansion of the noise margin can be intended with a small area. In addition, further expansion of the noise margin can be obtained by inserting a shield line between the first word line and the second word line. In this case, the problem of an area increase does not occur because no shield line is necessary between the word lines of an identical port (between neighboring first word lines and between neighboring second word lines).

Further, the semiconductor device according to one embodiment of the present invention includes a first selector circuit and a second selector circuit disposed in the vicinity of one side of a rectangular area having the plurality of memory cells disposed therein. The above plurality (defined as N) of columns is divided into K (=N/M) by the unit of M, and correspondingly thereto, K first selector circuits and K second selector circuits are disposed. Each of the K first selector circuits has a function of selecting one from among M first bit lines included in M columns, and each of the K second selector circuits has a function of selecting one from among M second bit lines included in the M columns. A J-th first selector circuit, which is one of the K first selector circuits, is disposed adjacent to a J-th second selector circuit which is one of the K second selector circuits.

With such the configuration, a first wiring line for wiring M first bit lines included in certain M columns to a J-th first selector circuit comes to intersect with a second wiring line for wiring M second bit lines included in the above M columns to a J-th second selector circuit at least at a portion of the wiring line. Therefore, a shield line is provided so as to extend in the direction orthogonal to the bit line extension direction (i.e. the word line extension direction) in the above intersection portion, and the first wiring lines accompanying the aforementioned intersection are disposed side by side on one side of the above shield line, and the second wiring lines accompanying the aforementioned intersection are disposed side by side on the other side of the above shield line. Further, the first wiring lines and the second wiring lines accompanying the intersection are drawn via the wiring lines disposed side by side on both sides of the shield line.

With this, in the intersection portion between the first wiring line and the second wiring line, it becomes possible to reduce interference between the first wiring line and the second wiring line, that is, interference between different ports, possibly caused by mutual approximation, enabling an expanded noise margin. Additionally, such the intersection of wiring lines as described above does not occur when such the configuration is used that the first selector circuit is disposed on one side of a rectangular area, having a plurality of memory cells disposed therein, and the second selector circuit is disposed on the opposite side thereto. However, in the above configuration, there is produced a side effect of an increased circuit area, as compared with the configuration having both the first selector circuit and the second selector circuit disposed on one side, as described earlier.

Further, the semiconductor device according to one embodiment of the present invention includes a shield line between a first control signal for controlling the above-mentioned first selector circuit and a second control signal for controlling the second selector circuit. Specifically, the first control signal, the second control signal and the shield line extend in a direction that the first selector circuit and the second selector circuit are disposed in order (that is, an extension direction of the word lines), and further, the first control signal is disposed in juxtaposition on one side across the shield line and the second control signal is disposed in juxtaposition on the other side. With this, the interference between the first control signal and the second control signal, namely, the interference between different ports can be reduced, and the expansion of the noise margin can be attained.

Using the semiconductor device according to one embodiment of the present invention, it is possible to reduce the interference between different ports, to expand the noise margin, and to obtain the noise margin expansion with a small area.

BRIEF DESCRIPTION OF THE DRAWINGS

FIGS. 6(a) and 6 (b) show diagrams related to FIG. 5, where FIG. 6(a) is a plan view illustrating an exemplary layout configuration of a further upper layer than FIG. 5.

FIG. 12(a) is a plan view illustrating an exemplary layout configuration of a further upper layer than FIG. 5, and FIG. 12(b) is an equivalent circuit diagram of a layout image in the case that FIG. 5 is combined with FIG. 12(a);

FIG. 13(a) is an A-A' sectional view shown in FIG. 5 and FIG. 12(a) and FIG. 13(b) is a B-B' sectional view shown in FIG. 5 and FIG. 12(a);

FIG. 24(a) is an A-A' sectional view shown in FIG. 5 and FIG. 6(a), and FIG. 24(b) is a B-B' sectional view shown in FIG. 5 and FIG. 6(a).

DETAILED DESCRIPTION OF THE PREFERRED EMBODIMENTS

Figure 1:
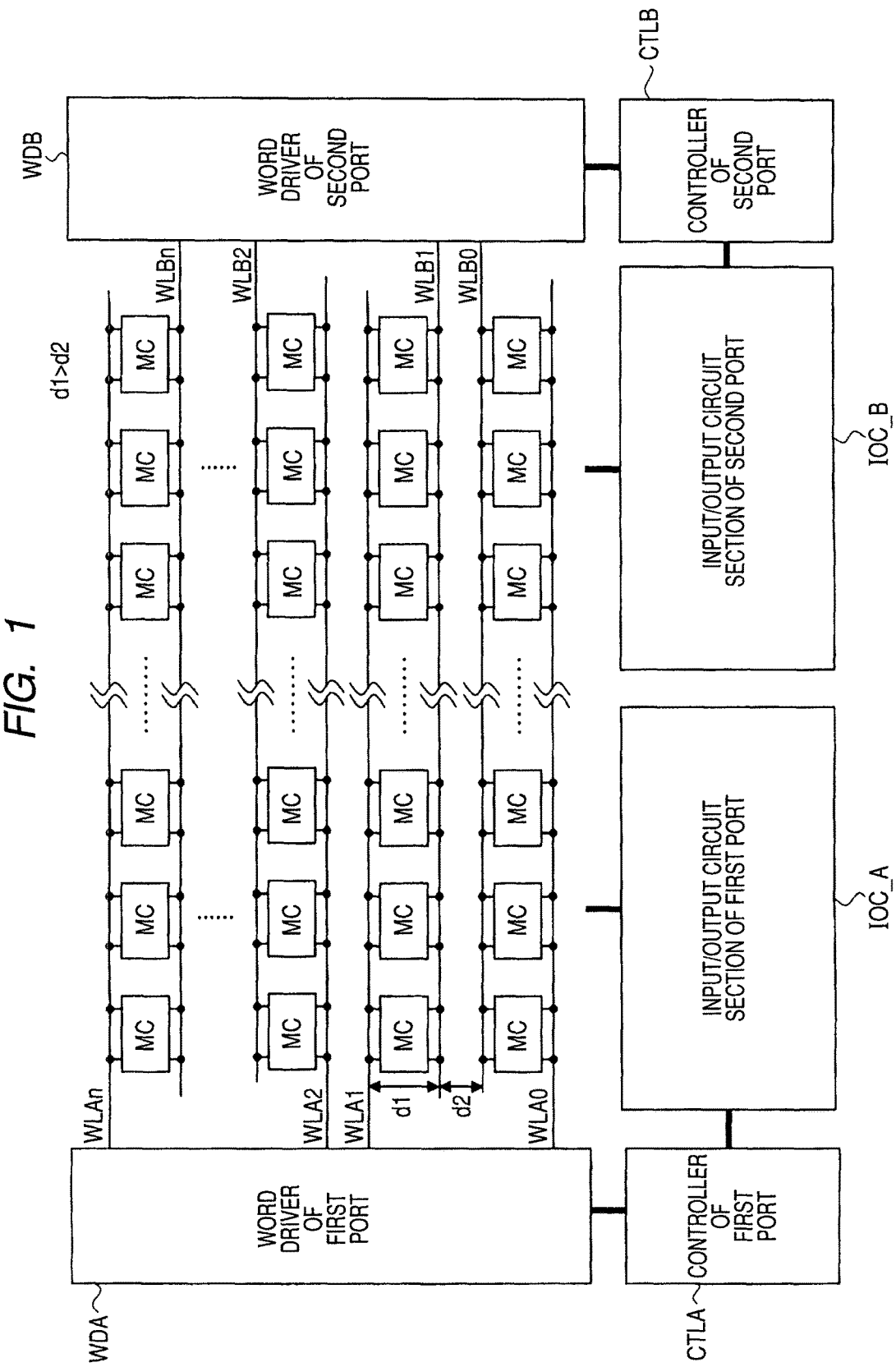
FIG. 1 shows a block diagram illustrating one exemplary configuration of a semiconductor device according to an embodiment 1 of the present invention.

Hereafter, preferred embodiments of the present invention will be described in detail referring to the drawings. In all the drawings illustrating the embodiments, in principle, like members are designated by like reference numerals and symbols, and repeated descriptions of such members are omitted. In the following embodiments, the descriptions are made by dividing into a plurality of sections or embodiments in the case of necessity for the sake of convenience. However, the above descriptions are not irrelevant to each other except for the cases of being particularly specified, and one has relationship to a deformed example, a detail or a complementary description of a portion or the whole of the others. Further, in the following embodiments, when the number of elements and the like (including the number of pieces, numerical values, quantities and ranges) are mentioned, it is not limited to the particular number thereof except for the cases either particularly specified or obviously to be limited to the particular number in view of the principle. It is also applicable to the cases of not less than or not more than the particular number.

Further, in the following embodiments, constituent elements thereof (including element steps) are not always essential except for the cases either particularly specified or obviously to be essential in principle, or the like, needless to say. Similarly, in the following embodiments, when the shape, the positional relation, etc. of the constituent elements are mentioned, virtual approximation and resemblance to the shape, etc. are to be included except for the cases either particularly specified or obviously to be otherwise in principle, or the like. The above description is also applied to the above numerical values and ranges.

Embodiment 1

Figure 2:
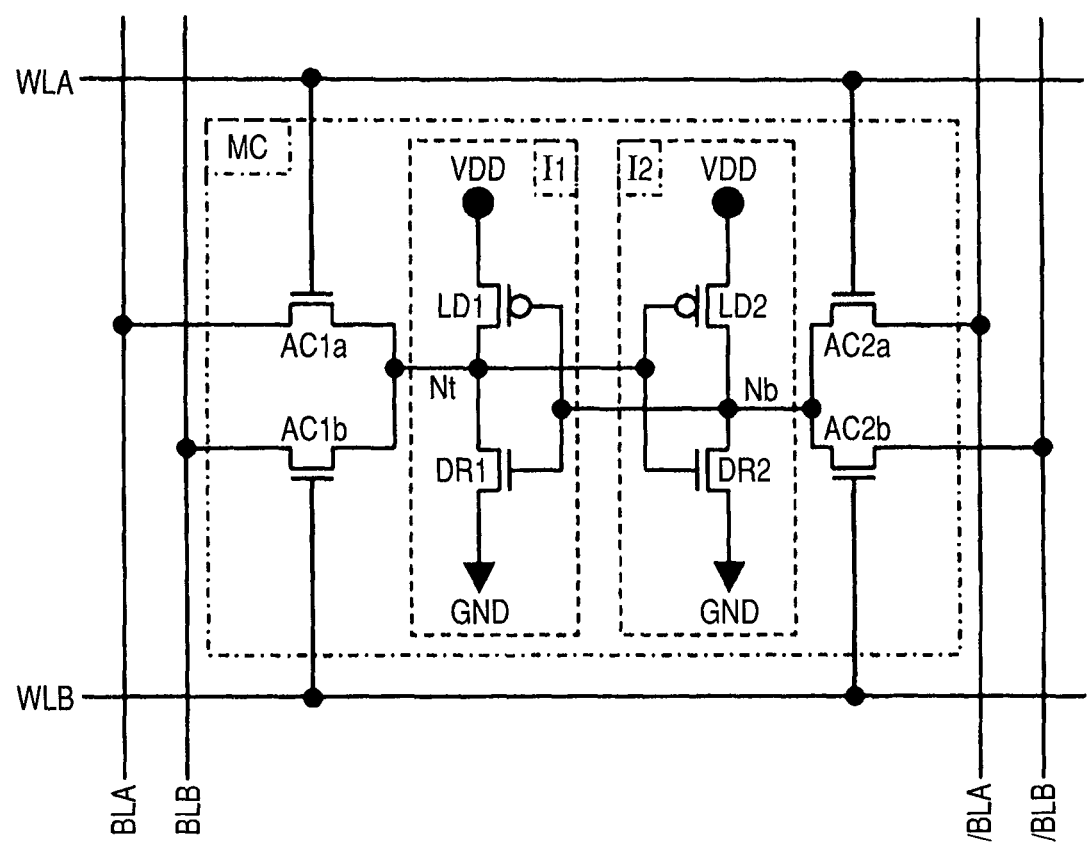
FIG. 2 shows a circuit diagram illustrating an exemplary configuration of a memory cell in the semiconductor device shown in FIG. 1.

FIG. 1 shows a block diagram illustrating one exemplary configuration of a semiconductor device according to an embodiment 1 of the present invention. FIG. 2 shows a circuit diagram illustrating an exemplary configuration of a memory cell MC in the semiconductor device shown in FIG. 1. The semiconductor device shown in FIG. 1 includes a plurality of memory cells MC disposed in the row and column shape (matrix shape), a word driver WDA for a first port (port A), a controller CTLA and an input/output circuit section IOC_A, and further, a word driver WDB for a second port (port B), a controller CTLB and an input/output circuit section IOC_B.

As shown in FIG. 2, each memory cell MC is a so-called SRAM memory cell, which includes two driver transistors DR1 and DR2, two load transistors LD1 and LD2, and four access transistors AC1a, AC1b, AC2a and AC2b. Here, the driver transistors DR1, DR2 and access transistors AC1a, AC1b, AC2a, AC2b are configured of NMOS transistors, while load transistors LD1, LD2 are configured of PMOS transistors.

LD1 and DR1 configure a first CMOS (Complementary Metal Oxide Semiconductor) inverter I1, and LD2 and DR2 configure a second CMOS inverter I2. One output terminal of each of the first and second inverters I1, I2 is mutually coupled to the input terminal of the other. With this, I1 and I2 configure one-bit latch circuit, so as to retain complementary storage information in a storage node Nt and an inverted storage node Nb. Each source of DR1, DR2 is coupled to a ground voltage GND, and each source of LD1, LD2 is coupled to a power supply voltage VDD.

The access transistor AC1a couples the storage node Nt and a bit line BLA for port A when a word line WLA for port A is activated, while AC2a couples the inverted storage node Nb and an inverted bit line /BLA for port A when WLA is activated. Similarly, the access transistor AC1b couples the storage node Nt and a bit line BLB for port B when a word line WLB for port B is activated, while AC2b couples the inverted storage node Nb and an inverted bit line /BLB for port B when WLB is activated.

BLA and /BLA configure a bit line pair for port A, while BLB and /BLB configure a bit line pair for port B. The word lines WLA, WLB are respectively disposed side by side in the row direction, while the bit lines BLA, /BLA, BLB, and /BLB are respectively disposed side by side in the column direction. Further, one row is configured of a word line group including two word lines WLA, WLB, while one column is configured of a bit line group including four bit lines BLA, /BLA, BLB, and /BLB. Each memory cell MC comes to be disposed at the intersection of each row (word line group) and each column (bit line group).

In FIG. 1, a word driver WDA drives a plurality of word lines respectively disposed side by side in the row direction, while a word driver WDB drives a plurality of word lines WLB respectively disposed side by side in the column direction. WDA and WDB are disposed mutually oppositely to sandwich the area of the memory cell MC. The input/output circuit section IOC_A reads and writes information targeting the bit line pair (BLA, /BLA) for port A, being coupled to the memory cell MC, while the input/output circuit section IOC_B reads and writes information targeting the bit line pair (BLB, /BLB) for port B, being coupled to the memory cell MC. Additionally, in FIG. 1, each bit line pair is omitted for convenience.

A controller CTLA controls a non-illustrated plurality of word driver circuits included in WDA on receiving an externally input address signal for port A, and also controls a non-illustrated plurality of readout circuits (sense amplifier circuits etc.), write circuits, etc. included in IOC_A. Similarly, a controller CTLB controls a non-illustrated plurality of word driver circuits included in WDB on receiving an externally input address signal for port B, and also controls a non-illustrated plurality of readout circuits, write circuits, etc. included in IOC_B.

In such the configuration, one of the principal features of the semiconductor device according to the present embodiment 1 is that the plurality of word lines WLA, WLB are disposed with an alternating arrangement of the word lines WLA, WLB on a row-by-row basis, like WLA0, WLB0, WLB1, WLA1, WLA2, . . . . In other words, it is configured that a word line WLA of a certain row is disposed adjacent to the right neighboring (or left neighboring) row word line WLA, and a word line WLB of a certain row is disposed adjacent to the left neighboring (or right neighboring) row word line WLB. Further, as another principal feature of the semiconductor device according to the present embodiment 1, in regard to mutually adjacent word lines, the disposition is made in such a manner that a pitch d1 between word lines for different ports (WLA-WLB) is made larger than a pitch d2 between word lines for an identical port (WLA-WLA or WLB-WLB). Hereinafter, more detailed description is made including the above features.

Figure 3:
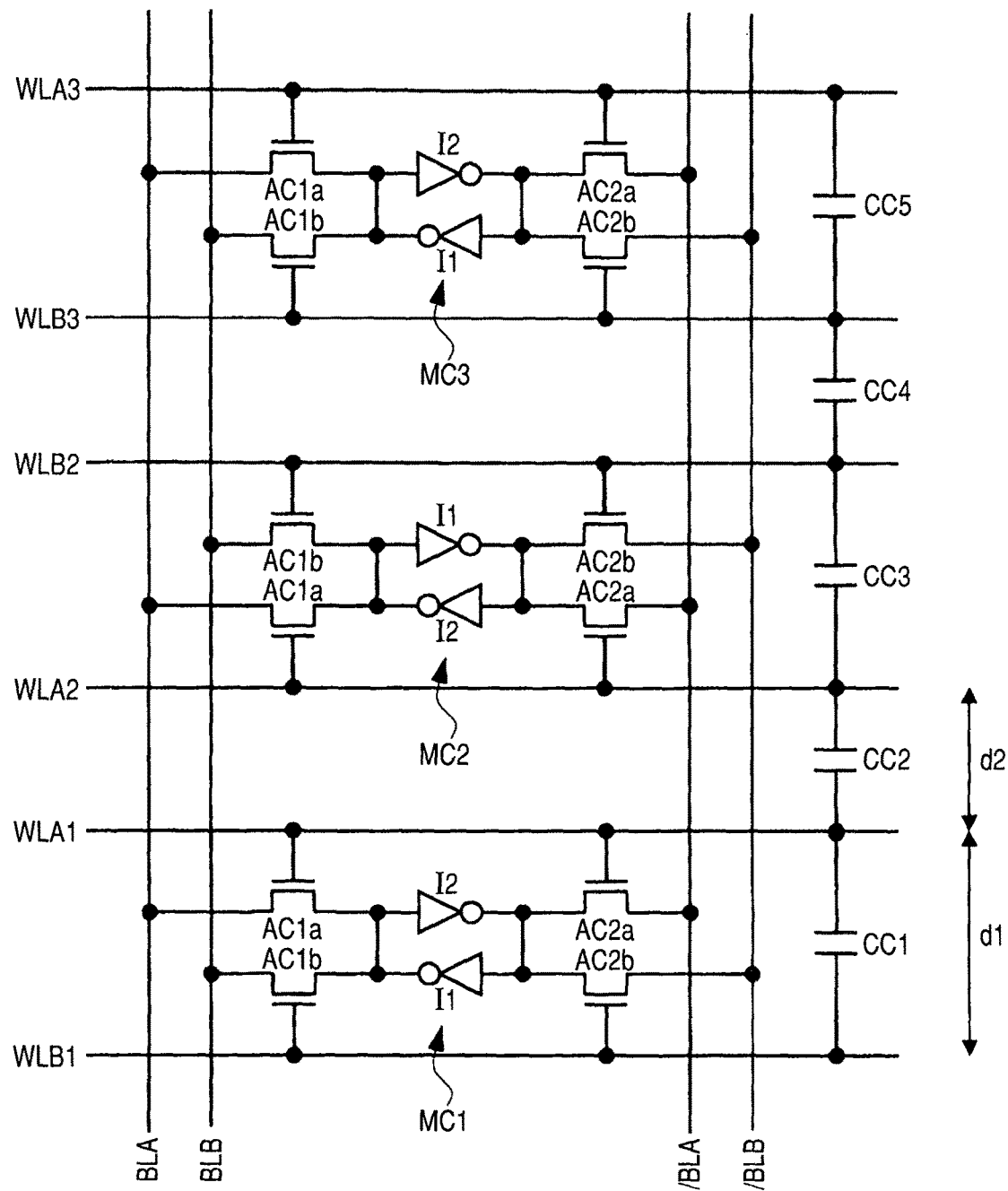
FIG. 3 shows a circuit diagram illustrating an exemplary partial configuration of a plurality of memory cells in the semiconductor device shown in FIG. 1.

FIG. 3 shows a circuit diagram illustrating an exemplary partial configuration of a plurality of memory cells MC in the semiconductor device shown in FIG. 1. In FIG. 3, there are shown memory cells MC1 to MC3 for three rows disposed in order on an identical column (bit lines BLA, /BLA, BLB and /BLB). The word lines WLA1, WLB1 are coupled to MC1, the word lines WLA2, WLB2 are coupled to MC2, and the word lines WLA3, WLB3 are coupled to MC3. The disposition in the row direction of each word line is in order of WLB1, WLA1, WLA2, WLB2, WLB3, and WLA3, as described earlier. Further, for example, the pitch d1 between WLB1 and WLA1, which is to be the first row, is larger than the pitch d2 between WLA1 and WLA2 which is to be a gap between the first row and the second row.

Figure 21:
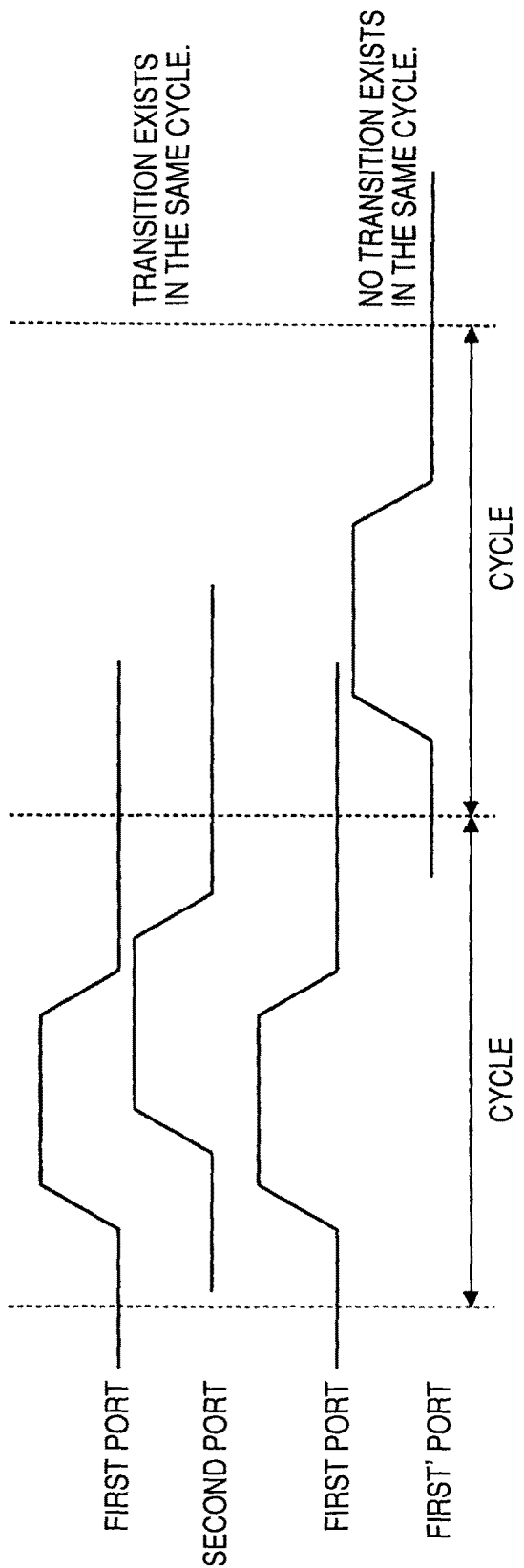
FIG. 21 shows an explanatory diagram illustrating one example of operation waveforms between different ports and in an identical port.
Figure 22:
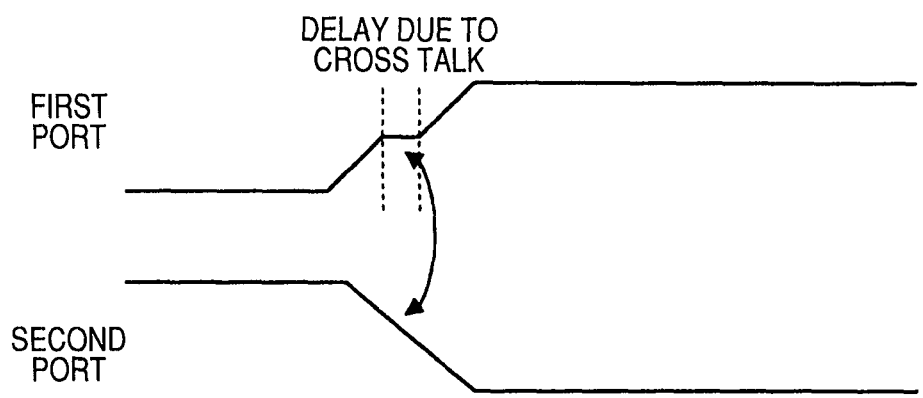
FIG. 22 shows an explanatory diagram illustrating one example of a trouble due to interference between ports.

For example, WLA1 interferes with WLB1 by a parasitic capacitor (coupling capacitor) CC1 and also interferes with WLA2 by a parasitic capacitor CC2. Accompanying an asynchronous operation, there may possibly be produced signal transition (activation or deactivation) in both WLA1 and WLB1 within an identical cycle, as described in FIG. 21. On the other hand, no signal transition is produced in both WLA1 and WLA2 within an identical cycle. Therefore, the pitch d1 is designed to have a sufficient noise margin in consideration of a layout area required for the memory cell MC1 and bidirectional interference between WLA1 and WLB1. In contrast, the pitch d2 can be designed to the minimum as compared with the pitch d1, because it is sufficient to consider one-directional coupling noise from one of WLA1 and WLA2 to the other.

Figure 20:
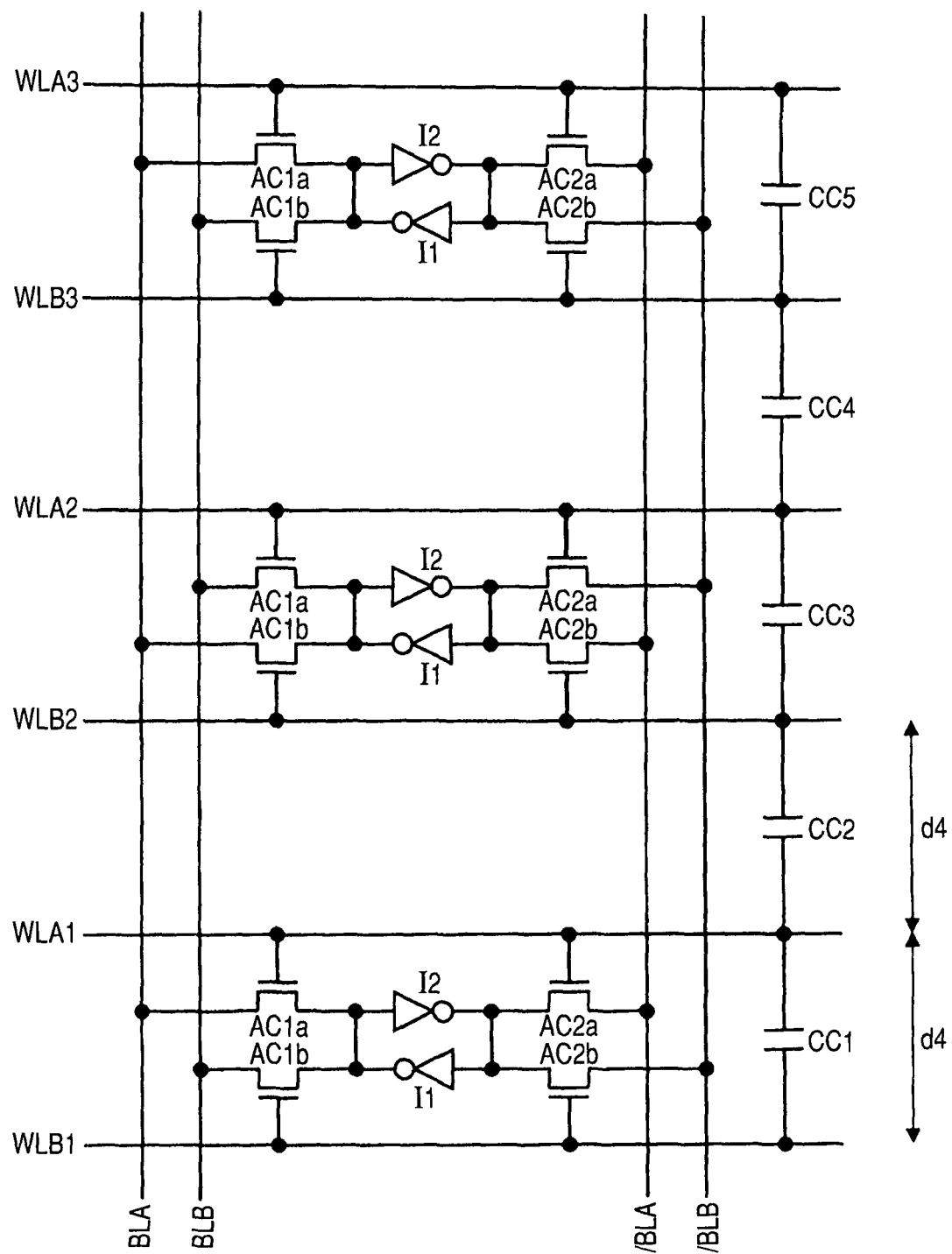
FIG. 20 shows a circuit diagram of an exemplary configuration of a multiport memory having been studied as a premise of the present invention.

Thus, using the semiconductor device according to the present embodiment 1, it is possible to obtain a semiconductor device having a large noise margin. In particular, since interference between ports can be reduced, the noise margin can be expanded. Also, it is possible to obtain a semiconductor device having a large noise margin with a small area. Specifically, for example, in case of the word line disposition as shown in FIG. 20 described earlier, to expand the noise margin, it is necessary to widen the entire pitches between the word lines, which causes an increased circuit area. However, as compared therewith, using the word line disposition according to the present embodiment, it is possible to intend an expanded noise margin with a small area.

Figure 4:
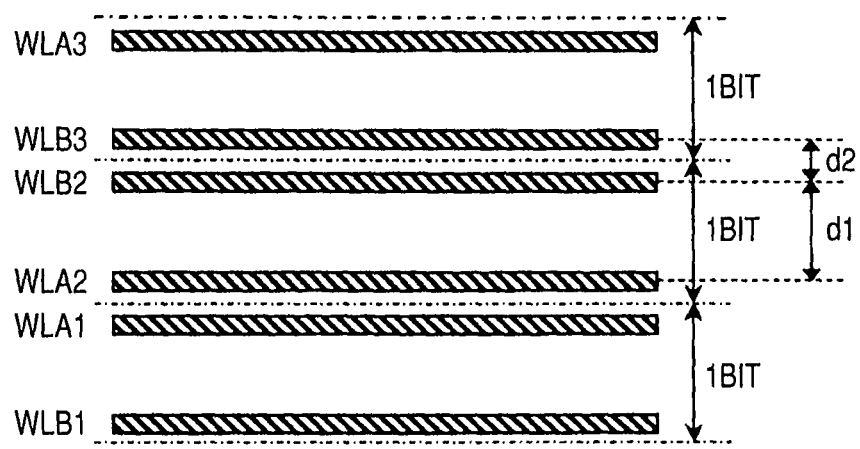
FIG. 4 shows a plan view illustrating an exemplary layout configuration in which only word lines are extracted in the exemplary circuit shown in FIG. 3.

FIG. 4 shows a plan view illustrating an exemplary layout configuration in which only the word line is extracted in the exemplary circuit shown in FIG. 3. When viewed as a layout, the exemplary circuit shown in FIG. 3 is configured in such a manner that three one-bit cells are arranged in the row direction, as shown in FIG. 4. In this case, the gap between the word lines in a cell (WLA and WLB) becomes wide, while the gap between the word lines between cells (WLA-WLA or WLB-WLB) becomes narrow.

Figure 5:
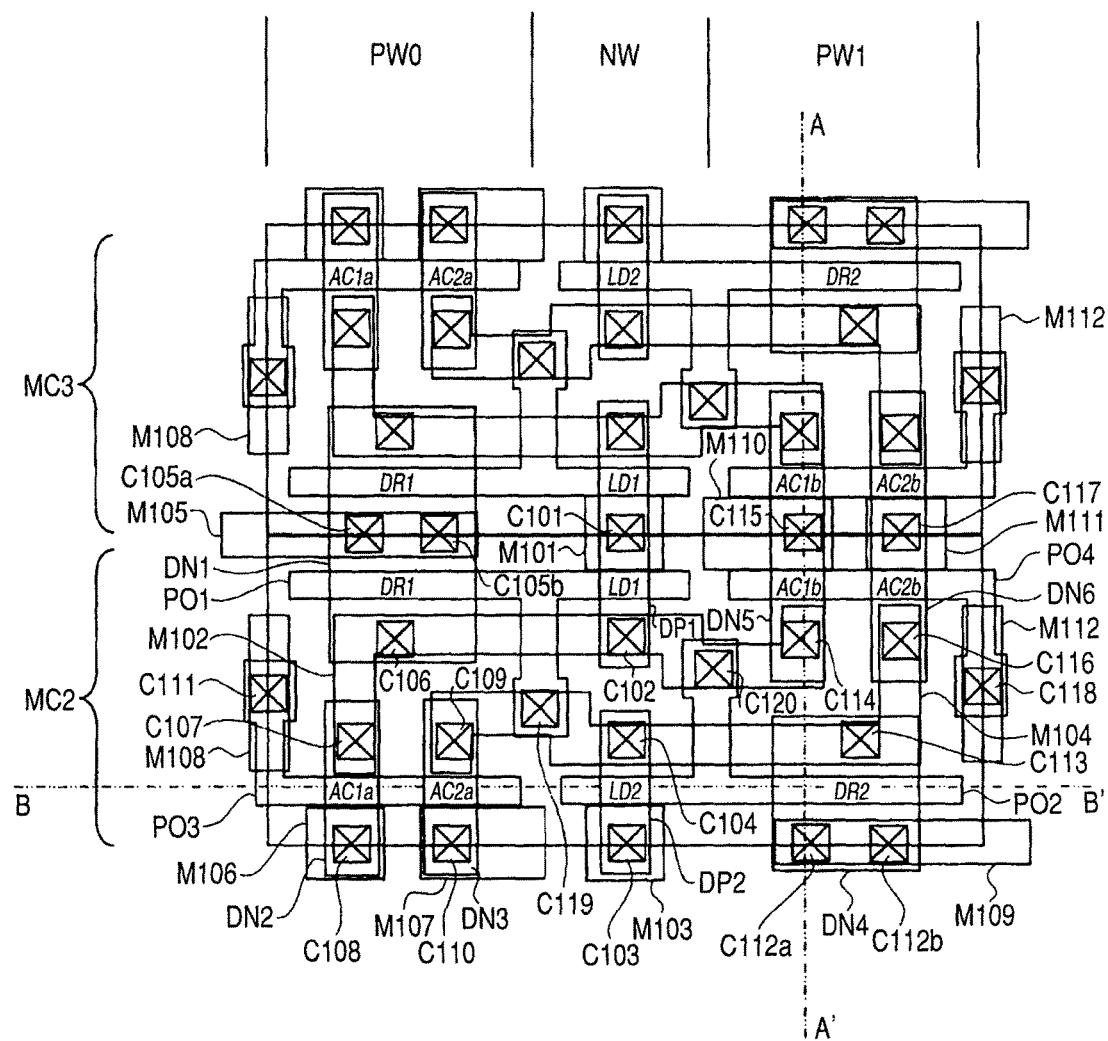
FIG. 5 shows a plan view illustrating an exemplary layout configuration including memory cells on the second row and the third row shown in FIG. 3.
Figure 6A:
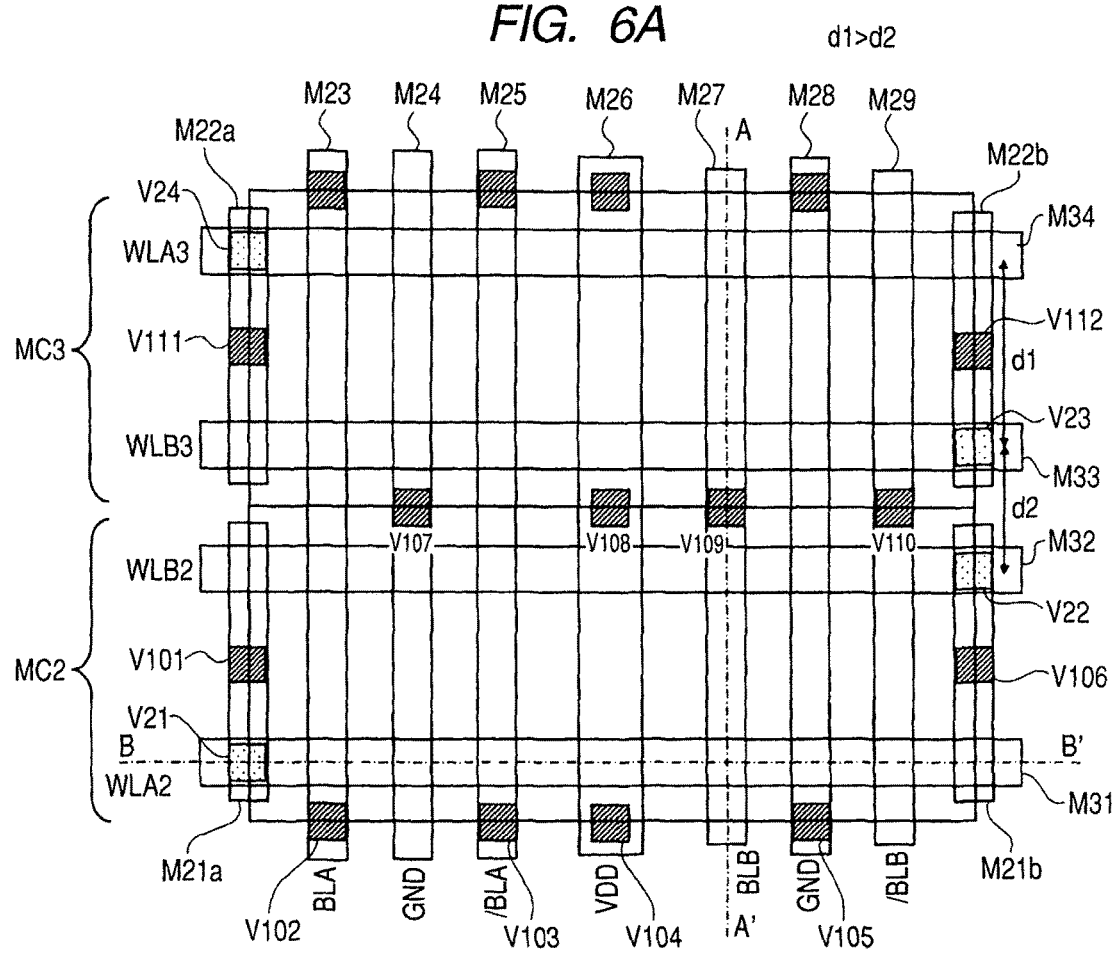
Figure 6B:
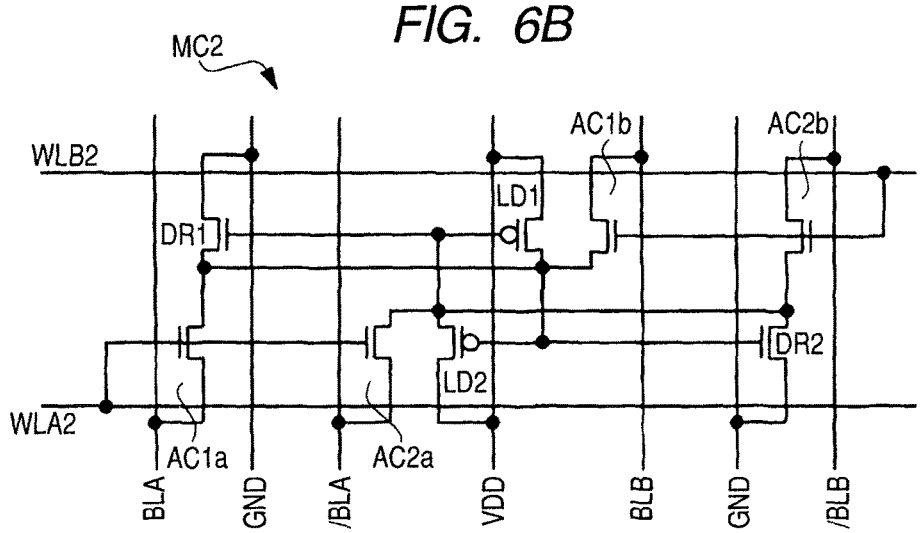
FIG. 6(b) is an equivalent circuit diagram of a layout image in the case that FIG. 5 is combined with FIG. 6(a)

FIG. 5 shows a plan view illustrating an exemplary layout configuration including memory cells MC2, MC3 on the second row and the third row shown in FIG. 3. FIGS. 6 (a) and 6 (b) show diagrams related to FIG. 5, where FIG. 6(a) is a plan view illustrating an exemplary layout configuration of a further upper layer than FIG. 5, and FIG. 6(b) is an equivalent circuit diagram of a layout image in the case that FIG. 5 is combined with FIG. 6 (a). FIG. 5 shows the exemplary layout configuration from a transistor-forming layer to a first metal wiring layer, while FIG. 6 (a) shows the exemplary layout configuration from a first via hole to a third metal wiring layer. First, the exemplary layout configuration of memory cell MC2 for one bit is described.

Referring to FIG. 5, on the surface of a semiconductor substrate, there are formed one N-type well area NW and two P-type well areas PW0, PW1 sandwiching the above N-type well area NW. In NW, load transistors LD1, LD2 which are PMOS transistors are formed. In PW0, there are formed a driver transistor DR1 and access transistors AC1a, AC2a, which are NMOS transistors, and also in PW1, there are formed a driver transistor DR2 and access transistors AC1b, AC2b which are NMOS transistors.

LD1 has a gate constituted of a polysilicon PO1, and a source and a drain formed on both sides of the gate, constituted of a P-type diffusion area DP1. The source is coupled to a first metal wiring layer M101 to which a supply voltage VDD is supplied via a contact C101. The drain is coupled to a first metal wiring layer M102 via a contact C102. LD2 has a gate constituted of a polysilicon PO2, and a source and a drain formed on both sides of the gate, constituted of a P-type diffusion area DP2. The source is coupled to a first metal wiring layer M103 to which the supply voltage VDD is supplied via a contact C103. The drain is coupled to a first metal wiring layer M104 via a contact C104.

DR1 has a gate also linked to the gate of LD1, constituted of the polysilicon PO1, and a source and a drain formed on both sides of the gate, constituted of an N-type diffusion area DN1. The source is coupled to a first metal wiring layer M105 to which a ground voltage GND is supplied via two contacts C105a, C105b. The drain is coupled to the first metal wiring layer M102 which is also linked to the drain of LD1 via a contact C106.

AC1a has a gate constituted of a polysilicon PO3, and a source and a drain formed on both sides of the gate, constituted of an N-type diffusion area DN2. One of the source and the drain is coupled to the first metal wiring layer M102 also linked to the drains of LD1 and DR1 via a contact C107. The other of the source and the drain is coupled to a first metal wiring layer M106 coupled to the bit line BLA via a contact C108. AC2a has a gate also linked to the gate of AC1a, constituted of a polysilicon PO3, and a source and a drain formed on both sides of the gate, constituted of an N-type diffusion area DN3. One of the source and the drain is coupled to the first metal wiring layer M104 also linked to the drain of LD2 etc. via a contact C109. The other of the source and the drain is coupled to a first metal wiring layer M107 coupled to the inverted bit line /BLA via a contact C110. Further, the polysilicon PO3 to be the gates of AC1a, AC2a is coupled to a first metal wiring layer M108 coupled to the word line WLA via a contact C111.

Now, DR2 has a gate also linked to the gate of LD2, constituted of the polysilicon PO2, and a source and a drain formed on both sides of the gate, constituted of an N-type diffusion area DN4. The source is coupled to the first metal wiring layer M109 to which the ground voltage GND is supplied via two contacts C112a, C112b. The drain is coupled to the first metal wiring layer M104 also linked to the drain of LD2 via a contact C113.

AC1b has a gate constituted of a polysilicon PO4, and a source and a drain formed on both sides of the gate, constituted of an N-type diffusion area DN5. One of the source and the drain is coupled to the first metal wiring layer M102 also linked to the drains of LD1 and DR1 via a contact C114. The other of the source and the drain is coupled to a first metal wiring layer M110 coupled to the bit line BLB via a contact C115. AC2b has a gate also linked to the gate of AC1b, constituted of a polysilicon PO4, and a source and a drain formed on both sides of the gate, constituted of an N-type diffusion area DN6. One of the source and the drain is coupled to the first metal wiring layer M104 also linked to the drain of LD2 etc. via a contact C116. The other of the source and the drain is coupled to a first metal wiring layer M111 coupled to the inverted bit line /BLB via a contact C117. Further, the polysilicon PO4 to be the gates of AC1b, AC2b is coupled to a first metal wiring layer M112 coupled to the word line WLB via a contact C118.

Further, the polysilicon PO1 to be the gates of DR1 and LD1 is coupled to the first metal wiring layer M104 being conducted to the drain of LD2 etc. via a contact C119, and the polysilicon PO2 to be the gates of DR2 and LD2 is coupled to the first metal wiring layer M102 being conducted to the drain of LD1 etc. via a contact C120. Additionally, each of P-type diffusion areas DP1, DP2 is formed by injecting P-type impurities into the N-type well area NW using the corresponding polysilicon gate as a mask, and also, each of N-type diffusion areas DN1 to DN6 is formed by injecting N-type impurities into the P-type well areas PW0, PW1 using the corresponding polysilicon gate as a mask.

Next, referring to FIG. 6(a), over the upper layer of FIG. 5, second metal wiring layers M21a, M21b are formed on the left and right sides, and second metal wiring layers M23 to M29 are formed being disposed side by side in a line shape therebetween. M23 and M25 respectively correspond to the bit line BLA and the inverted bit line /BLA, and the ground voltage GND is supplied to M24 disposed therebetween. M27 and M29 respectively correspond to the bit line BLB and the inverted bit line /BLB, and the ground voltage GND is supplied to M28 disposed therebetween. Further, the supply voltage VDD is supplied to M26 disposed between M25 and M27.

M21a is coupled to the first metal wiring layer M108 shown in FIG. 5 via a first via hole V101, and M21b is coupled to the first metal wiring layer M112 shown in FIG. 5 via a first via hole V106. M23 is coupled to the first metal wiring layer M106 shown in FIG. 5 via a first via hole V102, and M25 is coupled to the first metal wiring layer M107 shown in FIG. 5 via a first via hole V103, and M24 is coupled to the first metal wiring layer M105 shown in FIG. 5 via a first via hole V107. M27 is coupled to the first metal wiring layer M110 shown in FIG. 5 via a first via hole V109, and M29 is coupled to the first metal wiring layer M111 shown in FIG. 5 via a first via hole V110, and M28 is coupled to the first metal wiring layer M109 shown in FIG. 5 via a first via hole V105. Further, M26 is coupled to the first metal wiring layer M103 shown in FIG. 5 via a first via hole V104, and also coupled to the first metal wiring layer M101 shown in FIG. 5 via a first via hole V108.

As such, the second metal wiring layer is configured to be shielded between the bit line BLA (or BLB) and the inverted bit line /BLA (or /BLB) by the wiring (GND line) of the ground voltage GND, and also shielded between the inverted bit line /BLA for port A and the bit line BLB by the wiring (VDD line) of the supply voltage VDD. With this, it becomes possible to reduce interference between the wirings. In particular, the provision of the VDD line enables reduction of the interference between different ports.

Further, over the upper layer of the second metal wiring layer, there are formed third metal wiring layers M31, M32 disposed side by side in a line shape. M31 corresponds to the word line WLA2, and M32 corresponds to the word line WLB2. M31 is coupled to the second metal wiring layer M21a via a second via hole V21, and M32 is coupled to the second metal wiring layer M21b via a second via hole V22.

Next, in regard to the memory cell MC3 adjacent to the memory cell MC2, there is provided a layout configuration with line symmetry along the boundary line between MC2 and MC3, as shown in FIG. 5. Accordingly, the diffusion area (DN1), the contacts (C105a, C105b) and the first metal wiring layer (M105) located at the above boundary portion, which are to be the source of the driver transistor DR1 of MC2, are also commonly used as the source of the driver transistor DR1 of MC3. Similarly, the source of the load transistor LD1, and either the source or the drain of each access transistor AC1b, AC2b are also commonly used by MC2 and MC3. Additionally, though not shown in the figure, in regard to the boundary portion between MC2 and MC1 for example, the diffusion area, the contacts and the first metal wiring layer located at the above boundary portion are commonly used by MC2 and MC1.

Further, similarly in FIG. 6(a), MC2 and MC3 have layout configurations with line symmetry along the boundary line thereof. In MC3, similar to the case of MC2, a second metal wiring layer M22a for coupling the word line WLA and a second metal wiring layer M22b for coupling the word line WLB are disposed in line symmetry with M21a and M21b in MC2 across the boundary line described above. Therefore, as can be understood from FIG. 6(a), the arrangement order of respective word lines and the pitch between respective word lines can freely be adjusted by the position of each second via hole. Thus, the order of arrangement and the pitch relation (d1>d2) forming the aforementioned feature of the present embodiment 1 can be achieved easily.

Here, by laying out a second via hole V23 over M22b in MC3 and V22 over M21b in MC2 at a pitch d2, the pitch between the word line WLB3 (third metal wiring layer M33) coupled to V23 and WLB2 coupled to V22 is set at d2. Also, by laying out the above V23 and V24 over M22a at a pitch d1 in the row direction thereof, the pitch between the word line WLB3 coupled to V23 and WLA3 (third metal wiring layer M34) coupled to V24 is set at d1.

Figure 24A:
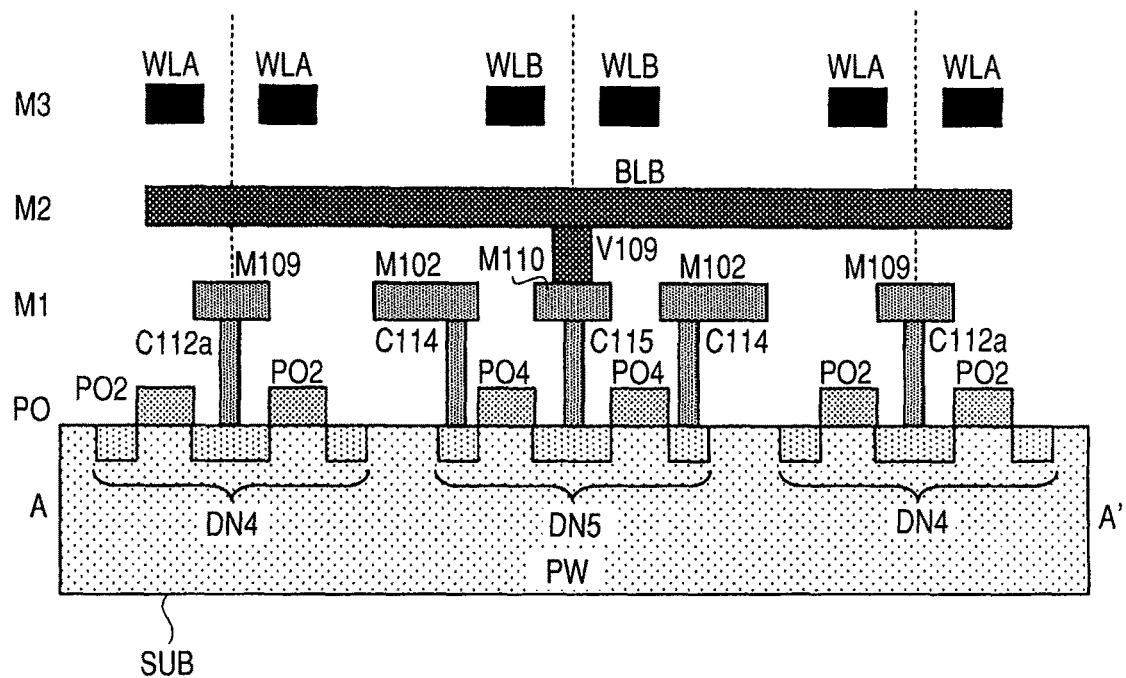
FIGS. 24(a) and 24(b) show exemplary section configurations in the case that FIG. 5 is combined with FIG. 6(a), where

FIG. 24 shows an exemplary section configuration in the case that FIG. 5 is combined with FIG. 6(a), where FIG. 6(a) is an A-A' sectional view shown in FIG. 5 and FIG. 6(a), and FIG. 6(b) is a B-B' sectional view shown in FIG. 5 and FIG. 6(a). In FIG. 24(a), a P-type well area PW is formed in the semiconductor substrate SUB, and the N-type diffusion areas DN4, DN5, which are to be either sources or drains of NMOS transistors, are formed in PW. Over the semiconductor substrate SUB, polysilicons PO2, PO4 which are to be the gates of MOS transistors are formed, and over the upper portion thereof, the first metal wiring layers M109, M110, and M102 are formed. The first metal wiring layers M109, M110, and M102 are coupled to the N-type diffusion areas DN4, DN5 via the corresponding contacts C112a, C114 and C115.

Over the upper portion of the first metal wiring layer, the bit line BLB constituted of a second metal wiring layer M2 is formed. BLB is coupled to the first metal wiring layer M110 via the first via hole V109. Over the upper portion of the second metal wiring layer M2, there is formed a third metal wiring layer M3 extending in the direction orthogonal to BLB (the direction penetrating through the paper). The word line WLA and the word line WLB are formed in M3. Here, the pitch between WLA-WLB is formed larger than the pitches between WLA-WLA and between WLB-WLB, thereby enabling reduction of interference between different ports.

Figure 24B:
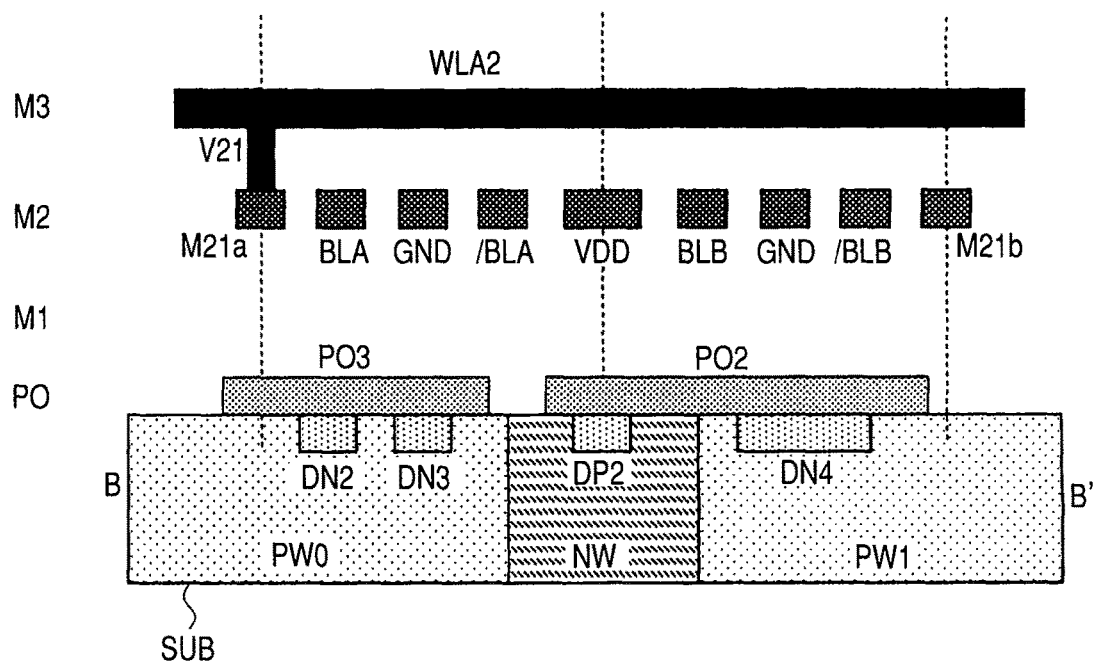

In FIG. 24(b), the P-type well areas PW0, PW1 and the N-type well area NW are formed in the semiconductor substrate SUB, and polysilicons PO2, PO3, which are to be the gates of the MOS transistors, are formed on SUB. The N-type diffusion areas DN2, DN3 are formed in PW0, the P-type diffusion area DP2 is formed in NW, and the N-type diffusion area DN4 is formed in PW1. Additionally, the above diffusion areas are shown for the sake of convenience, and practically, the areas correspond to the channel portions of a MOS transistor having the above diffusion areas on both sides, as can be understood from FIG. 5.

Over the upper portion of the polysilicon, the second metal wiring layer M2 is formed. In M2, M21a for coupling the word line WLA and M21b for coupling the word line WLB are formed on both sides, and further, the bit lines BLA, /BLA, BLB, /BLB, the GND lines and the VDD line are formed therebetween. The GND lines are disposed between BLA and /BLA and between BLB and /BLB, respectively, and also the VDD line is disposed between /BLA and BLB. The above GND lines and the VDD line can reduce interference between the bit lines, and in particular, the VDD line can reduce interference between the bit lines for different ports. Further, there is formed over M2 the word line WLA2, which is to be the third metal wiring layer M3, and this WLA2 is coupled to M21a via the second via hole V21.

Thus, using the semiconductor device according to the present embodiment 1, it becomes possible to obtain a semiconductor device having a large noise margin between word lines and /or between bit lines. Further, this semiconductor device having the large noise margin can be attained with a small area. In particular, between the word lines and /or between the bit lines, it becomes possible to expand a noise margin against interference between ports.

Embodiment 2

Figure 7:
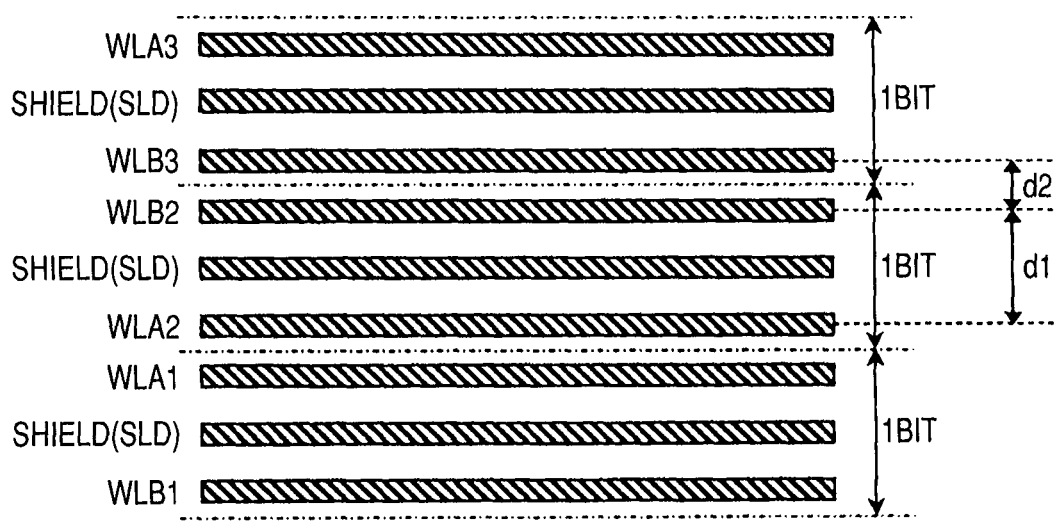
FIG. 7 shows a plan view illustrating an exemplary configuration of a semiconductor device deformed from the layout shown in FIG. 4, according to an embodiment 2 of the present invention.

FIG. 7 shows a plan view illustrating an exemplary configuration of a semiconductor device deformed from the layout shown in FIG. 4, according to an embodiment of the present invention. As shown in FIG. 7, the semiconductor device according to the present embodiment 2 has a principal feature of further providing a shield line SLD, which extends in juxtaposition with the word line between the word lines of different ports (between WLA and WLB), in addition to the word line layout similar to FIG. 4.

With the provision of such the shield line SLD, it becomes possible to further expand a noise margin between the word lines of different ports. Also, if the layout area of each memory cell can be restrained, it becomes possible to further decrease the pitch d1 between WLA and WLB as compared with the pitch d1 in case of FIG. 4 due to a shield effect, and thus, it becomes possible to expand the noise margin with a smaller area than the case of embodiment 1.

Figure 23:
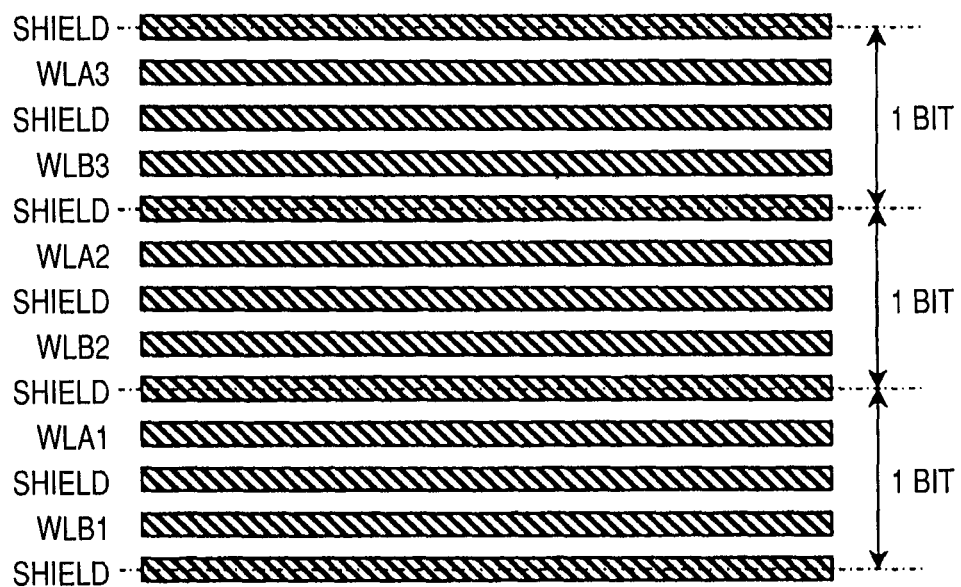
FIG. 23 shows a plan view illustrating an exemplary layout configuration of a word line when a shield wire is inserted between word lines in the semiconductor device shown in FIG. 20.

Also, since the order of arrangement of the word lines is made to be the order of arrangement as described in the embodiment 1, the number of shield lines can be reduced, and the noise margin can be expanded with a small area. Namely, by applying the shield line to the aforementioned exemplary configuration shown in FIG. 20 for example, the circuit area becomes increased as compared with the case shown in FIG. 7, because it is necessary to insert shield lines to the entire gaps between the word lines as shown in FIG. 23.

FIGS. 8 to 11 show circuit diagrams illustrating exemplary configurations of a memory cell corresponding to the exemplary layout configuration shown in FIG. 7, respectively showing examples of different shield line types. The exemplary circuits shown in FIGS. 8 to 11 are similar to the exemplary circuit shown in FIG. 3 except for the shield lines, and therefore the description on the overlapped portion is omitted.

Figure 8:
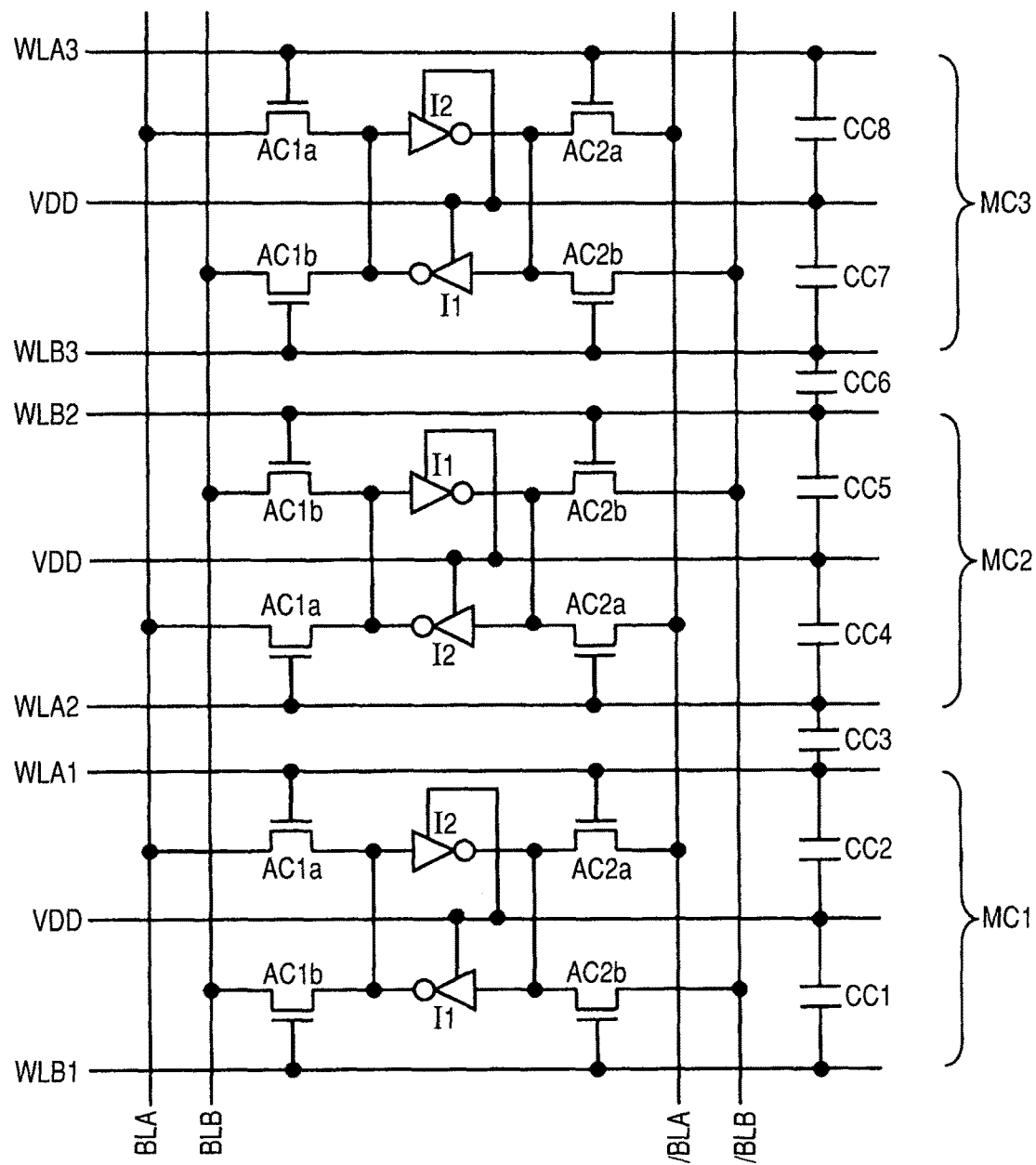
FIG. 8 shows a circuit diagram illustrating an exemplary configuration of a memory cell corresponding to the exemplary layout configuration shown in FIG. 7.
Figure 9:
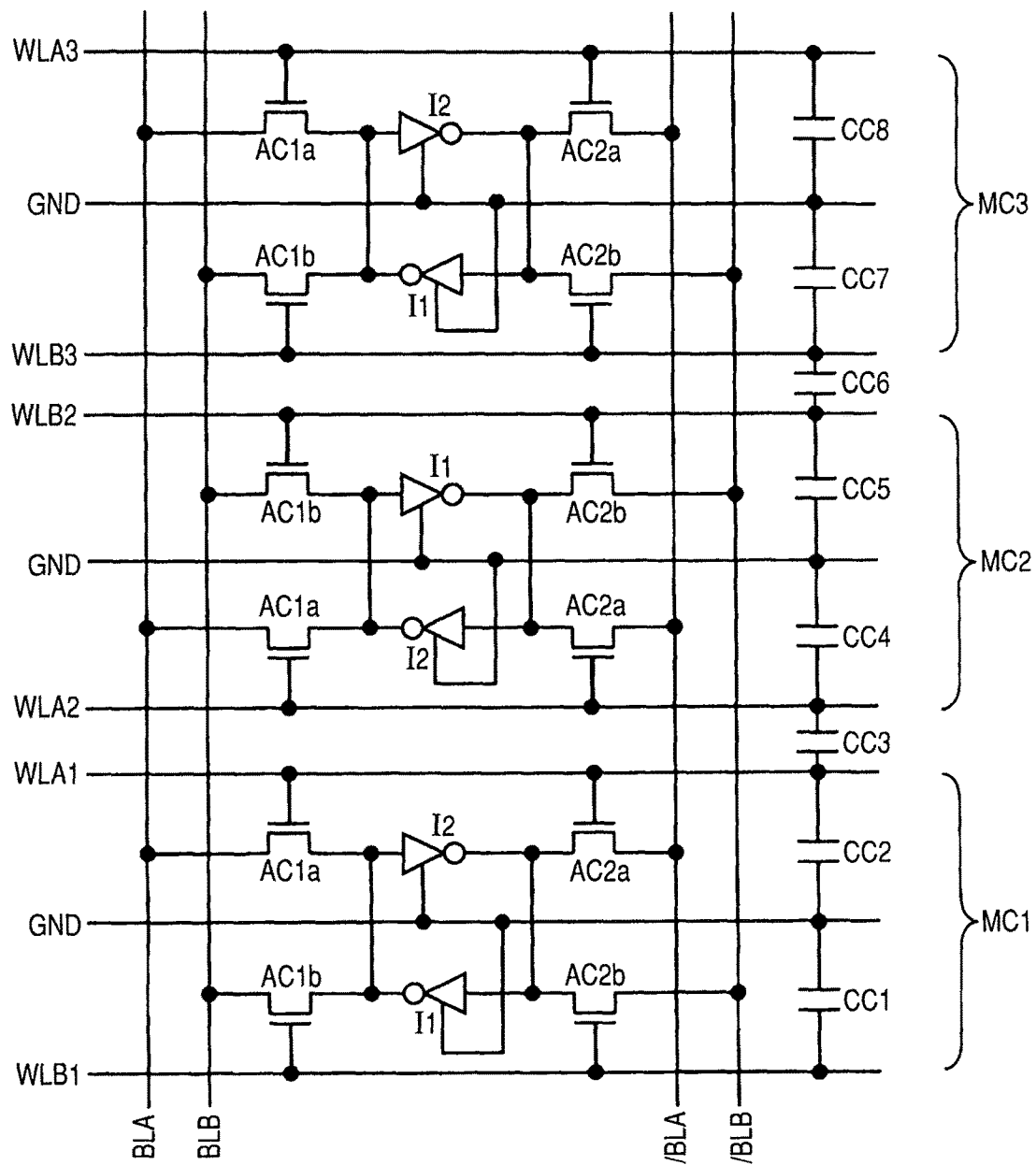
FIG. 9 shows a circuit diagram illustrating an exemplary configuration of another memory cell corresponding to the exemplary layout configuration shown in FIG. 7.

FIG. 8 shows an exemplary circuit when a VDD line is used as the shield line SLD shown in FIG. 7. This VDD line is coupled to a supply voltage VDD of inverters I1, I2 included in each of memory cells MC1 to MC3. FIG. 9 shows an exemplary circuit when a GND line is used as the shield line SLD shown in FIG. 7. This GND line is coupled to a ground voltage GND of the inverters I1, I2 included in of the memory cells MC1 to MC3.

Figure 10:
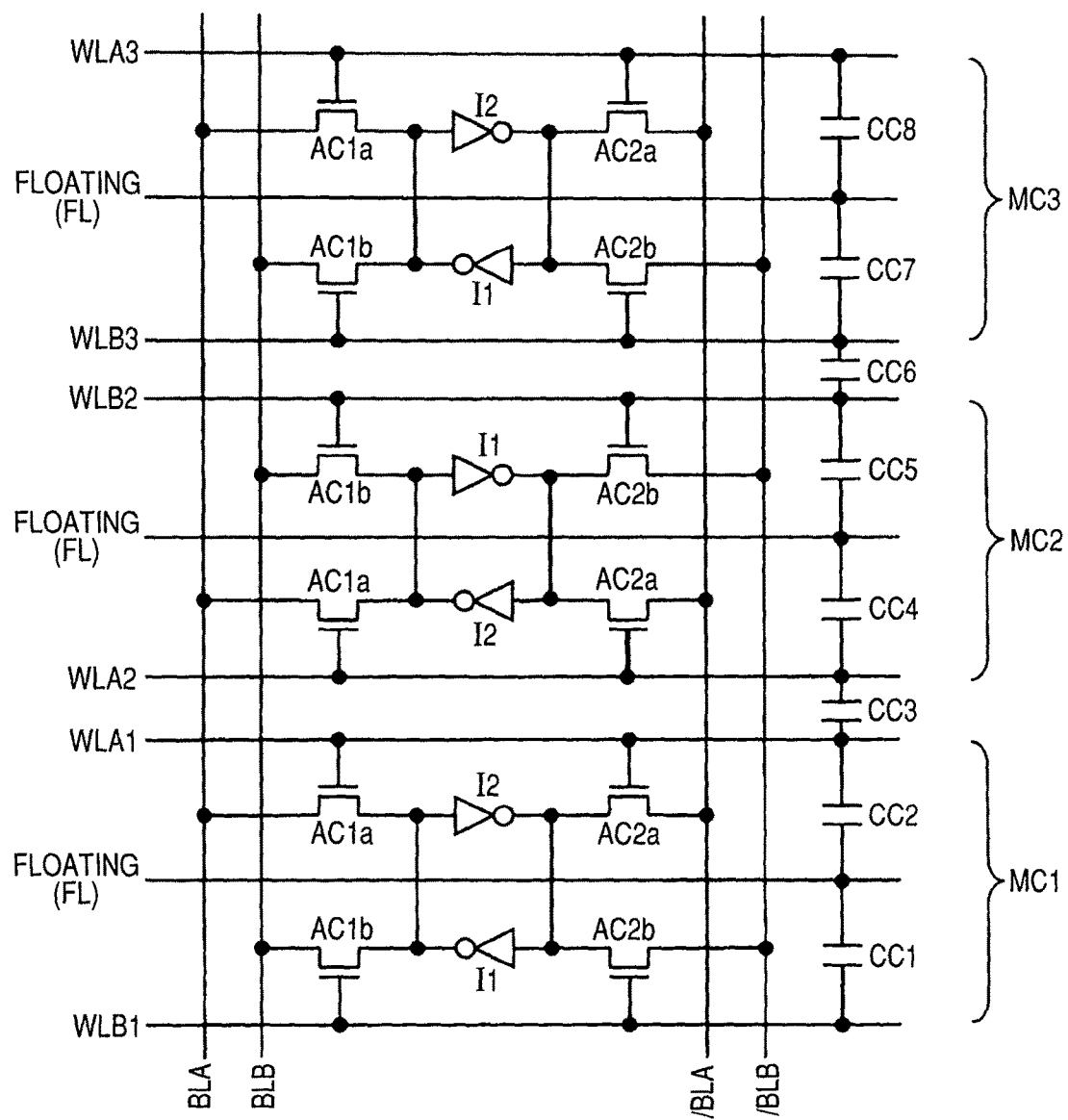
FIG. 10 shows a circuit diagram illustrating an exemplary configuration of still another memory cell corresponding to the exemplary layout configuration shown in FIG. 7.
Figure 11:
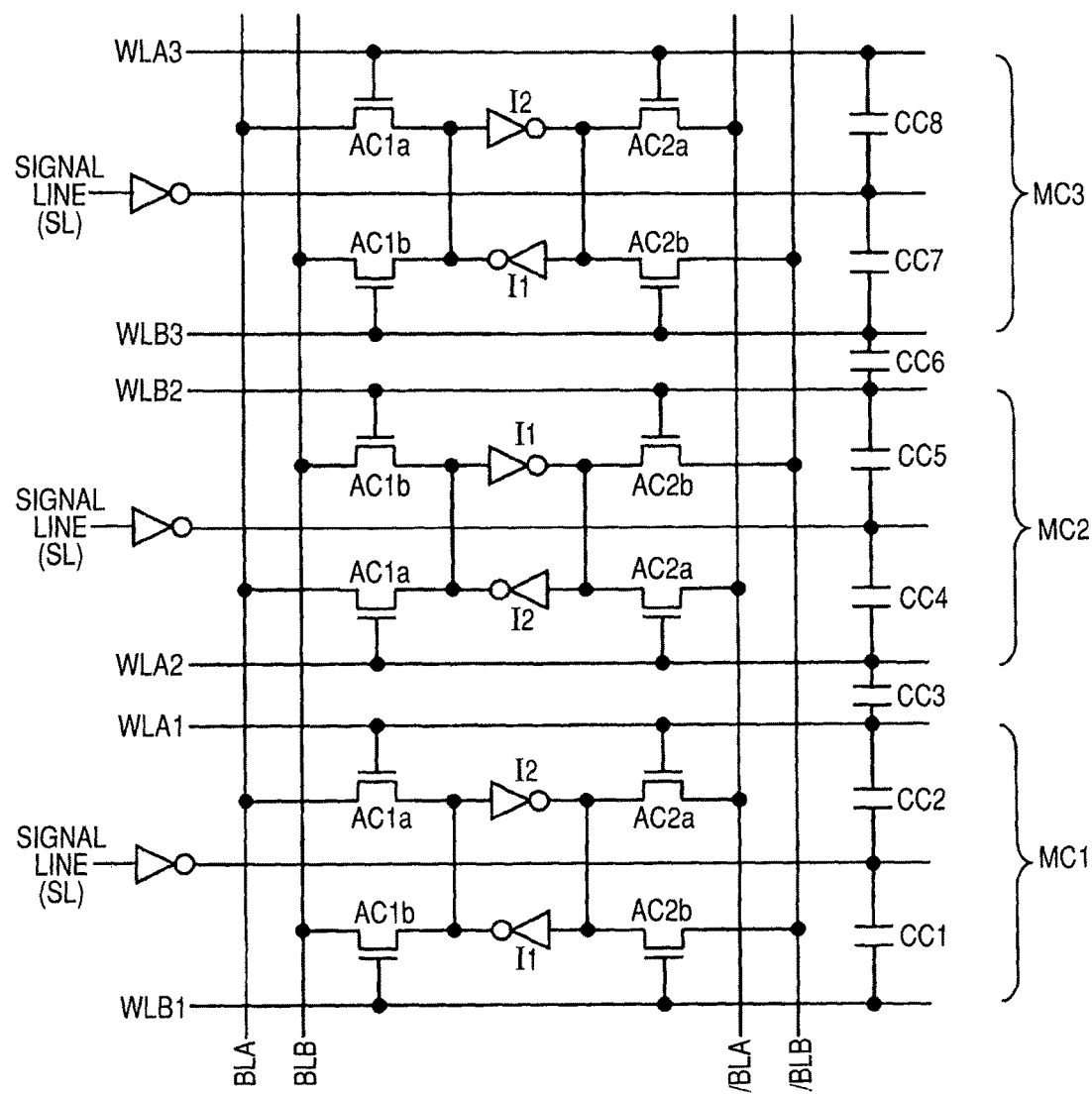
FIG. 11 shows a circuit diagram illustrating an exemplary configuration of still another memory cell corresponding to the exemplary layout configuration shown in FIG. 7.

FIG. 10 shows an exemplary circuit when a wiring to be a floating FL is used as the shield line SLD shown in FIG. 7. The wiring to be the floating FL has a sufficiently large parasitic capacitance, and therefore a shield effect can be expected to a certain extent. FIG. 11 is an exemplary circuit when a signal line SL is used as the shield line SLD shown in FIG. 7. To this signal line SL, there is applied a signal line which always becomes static during the transition process of the word lines WLA, WLB.

Figure 12A:
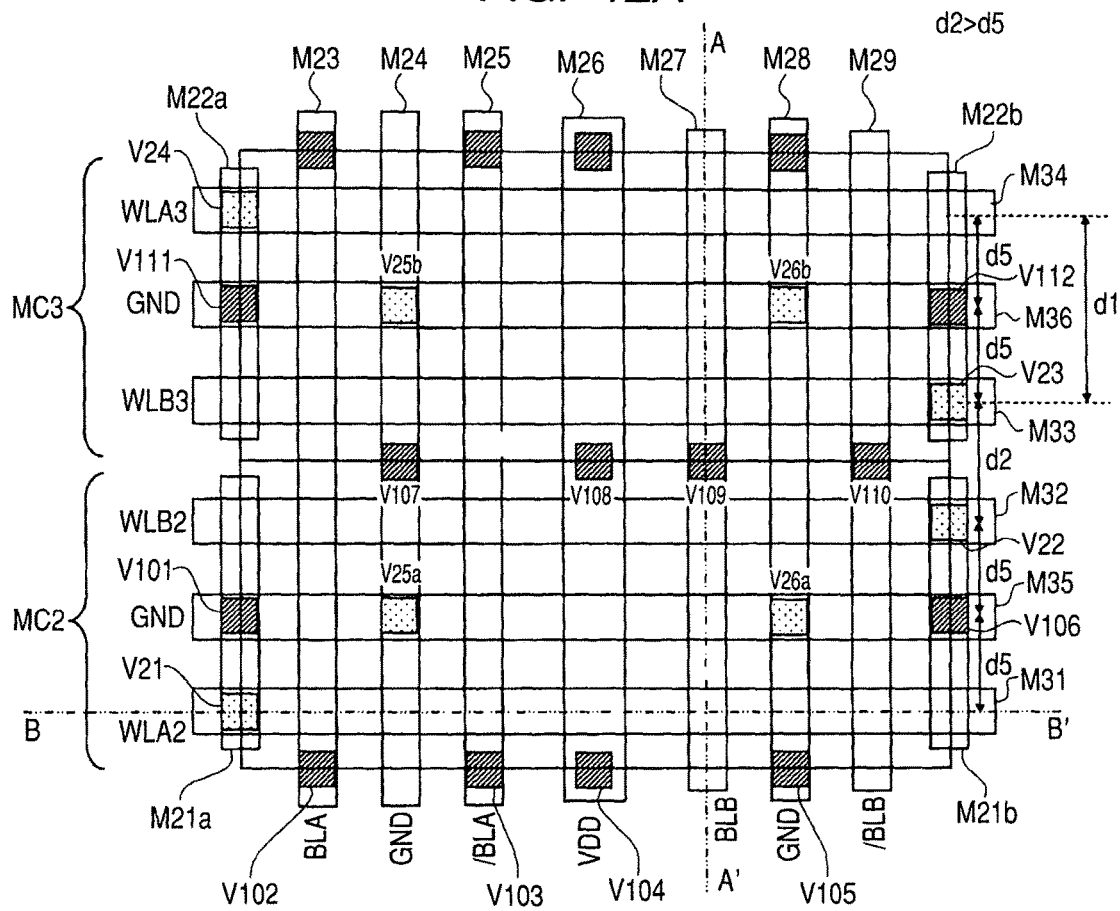
FIGS. 12(a) and 12(b) show diagrams related to FIG. 5 in a semiconductor device according to an embodiment 2 of the present invention, where
Figure 12B:
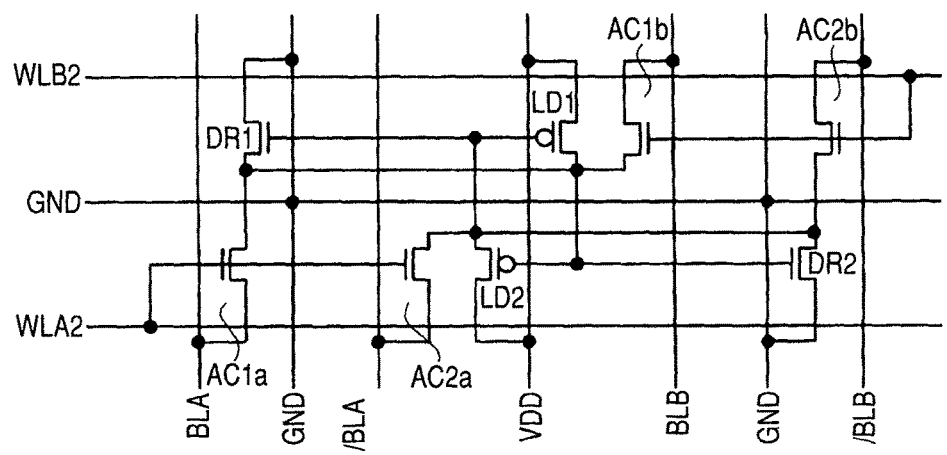

FIGS. 12(a) and 12(b) show diagrams related to FIG. 5 in the semiconductor device according to the embodiment 2 of the present invention, where FIG. 12(a) is a plan view illustrating an exemplary layout configuration of a further upper layer than FIG. 5, and FIG. 12(b) is an equivalent circuit diagram of a layout image in the case that FIG. 5 is combined with FIG. 12(a). FIGS. 12(a) and 12(b) are an exemplary layout configuration when the GND line is applied as the shield line SLD, as described in FIG. 9. The exemplary layout configuration shown in FIG. 12(a) illustrates a layout from the first via hole to the third metal wiring layer, and the layout from the first via hole to the second metal wiring layer is similar to the FIG. 6(a) described earlier. Therefore, the description will be given only on the difference from FIG. 6 (a).

In the exemplary layout configuration shown in FIG. 12 (a), there are added, to the exemplarily layout configuration shown in FIG. 6 (a), third metal wiring layers M35, M36 and accompanying second via holes V25a, V26a, V25b and V26b. M35 is disposed between the word line WLA2 (third metal wiring layer M31) of the memory cell MC2 and the word line WLB2 (third metal wiring layer M32). M35 is also coupled to the second metal wiring layer M24 disposed side by side with the bit lines, via V25a, and to the second metal wiring layer M28 disposed side by side with the bit lines, via V26a. As described earlier, M24 and M28 are GND lines, and M35 becomes the GND line also.

Similarly, M36 is disposed between the word line WLB3 (third metal wiring layer M33) and the word line WLA3 (third metal wiring layer M34) of the memory cell MC3. Further, M36 is coupled to the above-mentioned second metal wiring layer M24 via V25b, and also coupled to the above-mentioned second metal wiring layer M28 via V26b. Accordingly, M36 becomes the GND line also. Here, let d2 be the pitch between the word lines of an identical port mutually adjacent in the third metal wiring layer (between WLB2 and WLB3, for example), and let d5 be the pitch between mutually adjacent WLA and GND and between WLB and GND, then it is possible to satisfy d2>d5, for example. Here, in the above case also, because of the circuit area of the memory cell MC, in reality, the pitch d1 between WLA and WLB becomes d1(=2×d5)>d2, and a result becomes d2>d5>(d2/2).

Figure 13A:
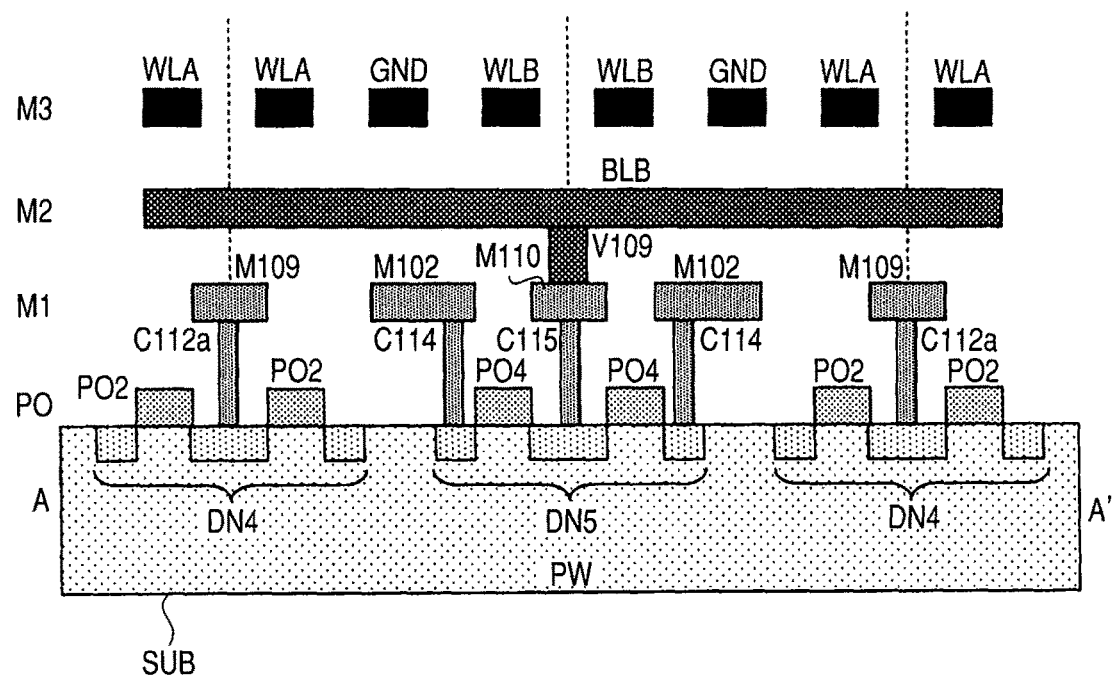
FIGS. 13(a) and 13(b) show an exemplary section configuration in the case that FIG. 5 is combined with FIG. 12(a), where
Figure 13B:
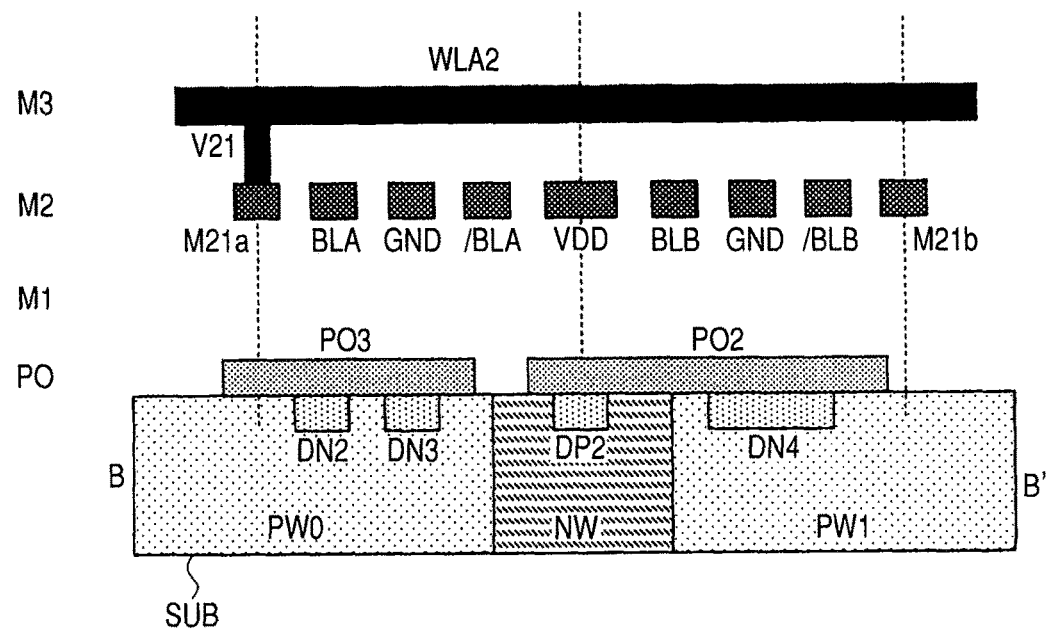

FIGS. 13(a) and 13(b) show diagrams of an exemplary section configuration in the case that FIG. 5 is combined with FIG. 12(a), where FIG. 13(a) is an A-A' sectional view shown in FIG. 5 and FIG. 12(a) and FIG. 13(b) is a B-B' sectional view shown in FIG. 5 and FIG. 12(a). As compared with the sectional view shown in FIG. 24 (a) described in the embodiment 1, the sectional view shown in FIG. 13(a) illustrates the configuration in which the third metal wiring layer M3 includes the GND line formed between the word lines WLA and WLB. Due to the shield effect accompanying the above GND line, interference between WLA and WLB is reduced. Here, as to other configurations, detailed description is omitted because of the similarity to FIG. 24(a). Also, as to the sectional view shown in FIG. 13(b), the detailed description is omitted because of the similarity to the aforementioned FIG. 24(b).

Thus, using the semiconductor device according to the present embodiment 2, because a shield between the word lines for different ports is added to the semiconductor device of the embodiment 1, it becomes possible to attain a semiconductor device having a large noise margin between the word lines and /or between the bit lines. Further, in some cases, it is possible to attain a semiconductor device having a large noise margin with a smaller area than the semiconductor device according to the embodiment 1.

Embodiment 3

Figure 14:
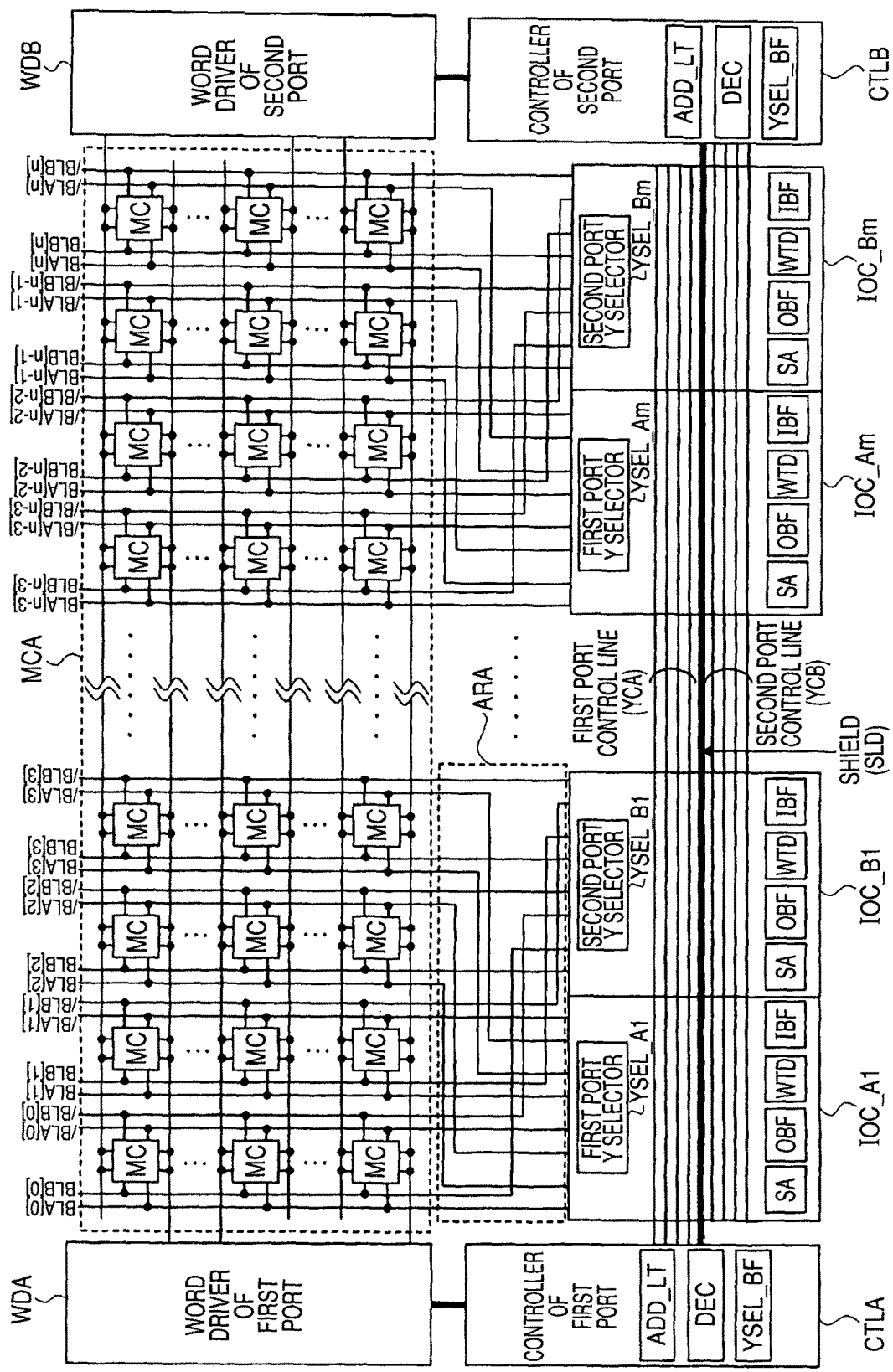
FIG. 14 shows a block diagram illustrating one exemplary configuration of a semiconductor device according to an embodiment 3 of the present invention.

FIG. 14 shows a block diagram illustrating one exemplary configuration of a semiconductor device according to an embodiment 3 of the present invention. As compared with the semiconductor device shown in FIG. 1, the principal features of the semiconductor device shown in FIG. 14 lie in: (1) the disposition of input/output circuit sections IOC_A, IOC_B; (2) the wiring layout from the bit line to the IOC_A, IOC_B; and (3) the disposition of each control line when the controllers CTLA, CTLB control the IOC_A, IOC_B. In the following, descriptions on the portions overlapped with FIG. 1 are omitted.

In FIG. 14, the controller CTLA of a first port (port A) includes a latch section ADD_LT for latching an address signal for the first port being input externally, a decoder DEC for decoding the above address signal, and a Y selection buffer section YSEL_BF for outputting a Y selection signal etc. corresponding to a Y address for the first port. Similarly, the controller CTLB of a second port (port B) includes a latch section ADD_LT for latching an address signal for the second port being input externally, a decoder DEC for decoding the above address signal, and a Y selection buffer section YSEL_BF for outputting a Y selection signal etc. corresponding to a Y address for the second port. DEC decodes one portion of the input address signal as X address, and the other portion as Y address, respectively. The result of the decoded X address is used to control the word drivers WDA, WDB, while the result of the decoded Y address is used to control the input/output circuit sections IOC_A, IOC_B via YSEL_BF.

Input/output circuit sections IOC_A1 to IOC_Am for the first port respectively include Y selectors YSEL_A1 to YSEL_Am for the first port, sense amplifier circuits SA, output buffer circuits OBF, write driver circuits WTD, and input buffer circuits IBF. Similarly, input/output circuit sections IOC_B1 to IOC_Bm for the second port respectively include Y selectors YSEL_B1 to YSEL_Bm for the second port, sense amplifier circuits SA, output buffer circuits OBF, write driver circuits WTD, and input buffer circuits IBF.

Figure 15:
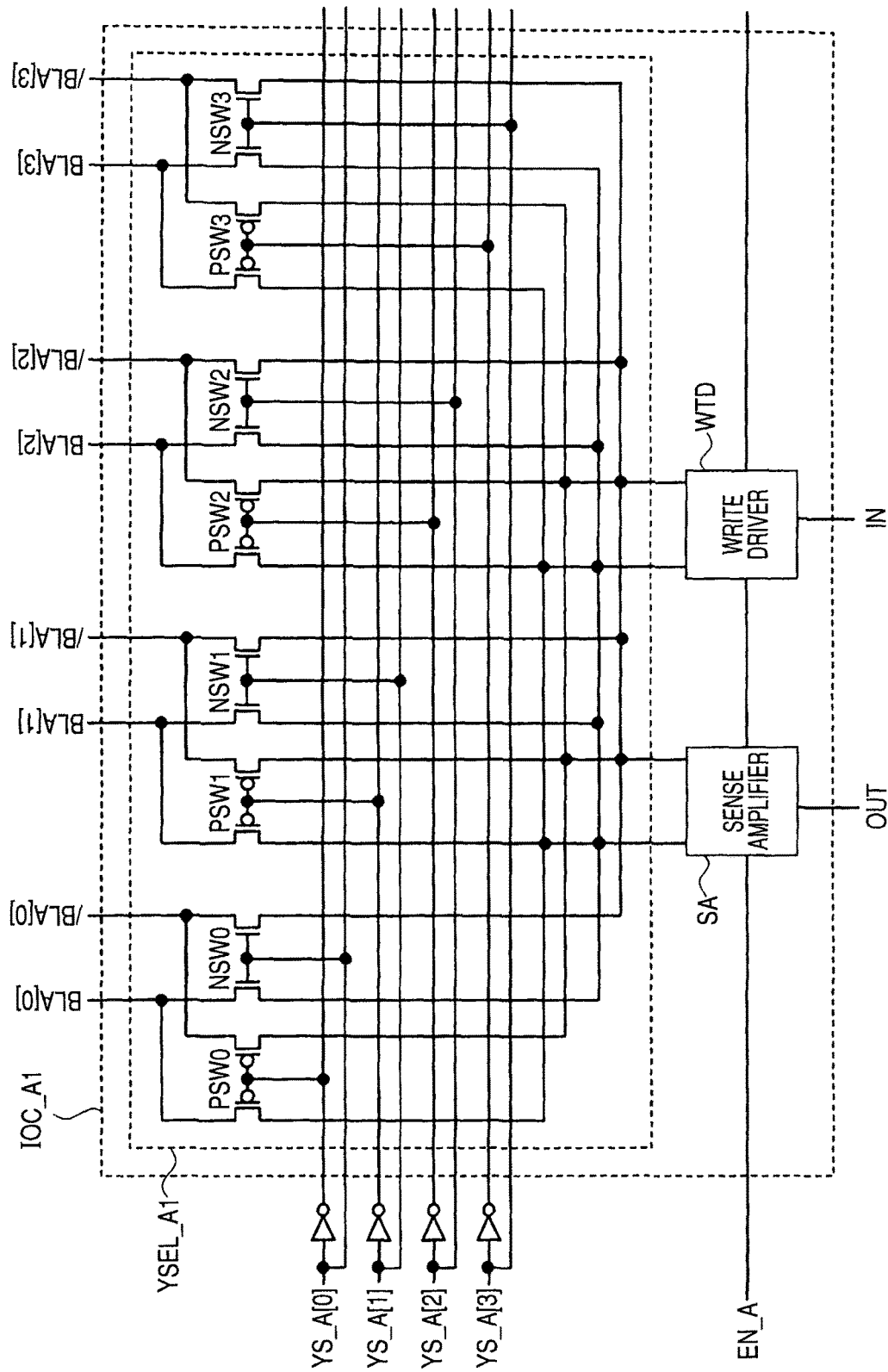
FIG. 15 shows a circuit diagram illustrating a detailed exemplary configuration of a principal part of an input/output circuit section in the semiconductor device shown in FIG. 14.

FIG. 15 shows a circuit diagram illustrating a detailed exemplary configuration of a principal part of each input/output circuit section in the semiconductor device shown in FIG. 14. Although the input/output circuit section IOC_A1 is shown in FIG. 15 as a representative example, the other input/output circuit sections IOC_A2 to IOC_Am and input/output circuit sections IOC_B1 to IOC_Bm have similar circuit configurations. As shown in FIG. 15, the input/output circuit section IOC_A1 has a circuit configuration of selecting one pair out of four bit line pairs (BLA[0], /BLA[0]) to (BLA[3], /BLA[3]) based on Y selection signals YS_A[0] to YS_A[3], so as to couple to the sense amplifier circuit SA and the write driver circuit WTD.

For example, when the Y selection signal YS_A[0] is in 'H' level and YS_A[1] to YS_A[3] are in 'L' level, BLA[0] and /BLA[0] are coupled to SA and WTD via a PMOS switch PSW0 and an NMOS switch NSW0. Similarly, when the YS_A[3] is in 'H' level and YS_A[0] to YS_A[2] are in 'L' level, BLA[3] and /BLA[3] are coupled to SA and WTD via a PMOS switch PSW3 and an NMOS switch NSW3. At the time of readout, a complementary signal of the above coupled bit line pair is amplified in SA, which is then output via the non-illustrated output buffer circuit OBF. At the time of writing, a complementary input signal being input via the input buffer circuit IBF (not shown) and the write driver circuit WTD is written into the above coupled bit line pair. Additionally, activation and deactivation of SA and WTD are controlled by an enable signal EN_A which is input at desired timing.

Similar to the above input/output circuit section IOC_A1, for example, the input/output circuit section IOC_B1 has a configuration of selecting one pair out of four bit line pairs (BLB[0], /BLB[0]) to (BLB[3], /BLB[3]) based on Y selection signals YS_B[0] to YS_B[3], so as to couple to the sense amplifier circuit SA and the write driver circuit WTD. The above SA and WTD in IOC_B1 are controlled by an enable signal EN_B. Also, for example, the input/output circuit section IOC_A2 has a configuration of selecting one pair out of four bit line pairs (BLA[4], /BLA[4]) to (BLA[7], /BLA[7]) based on the Y selection signals YS_A[0] to YS_A[3], so as to couple to the sense amplifier circuit SA and the write driver circuit WTD.

Such the Y selection signals YS_A[0] to YS_A[3] for the first port and the enable signal EN_A correspond to a first port control line YCA which is output from YSEL_BF of the controller CTLA of the first port shown in FIG. 14. Similarly, the Y selection signals YS_B[0] to YS_B[3] for the second port and the enable signal EN_B correspond to a second port control line YCB which is output from YSEL_BF of the controller CTLB of the second port shown in FIG. 14. Also, the PMOS switches PSW0 to PSW3 and the NMOS switches NSW0 to NSW3 included in the input/output circuit section IOC_A1 shown in FIG. 15 correspond to the Y selector YSEL_A1 of the first port shown in FIG. 14.

Although the above each input/output circuit section IOC is configured to select one pair out of the four bit line pairs, it is possible to suitably modify according to the number of simultaneous input/output signals (so-called IO structure). For example, in FIG. 14, when the number of columns is 256 (n=255), when the configuration of selecting one column out of four bit line pairs (four columns) is used, the number of simultaneous input/output signals (IO) for each port becomes 64 (=n/4). Accordingly, the value m in the input/output circuit sections IOC_A1 to IOC_Am and the input/output circuit sections IOC_B1 to IOC_Bm becomes 64. For example, when the above number of simultaneous input/output signals (IO) is to be 32, the value m may become 32, using the configuration of selecting one pair out of eight bit line pairs.

Here, in FIG. 14, an area in which the memory cell MC is disposed in a matrix shape is referred to as a memory cell disposition area MCA. MCA in the multiport memory normally has an oblong shape (rectangular shape) longer in the X direction (extension direction of the word lines) than in the Y direction (extension direction of the bit lines). A first feature point in the exemplary configuration shown in FIG. 14 lies in that, on one long side of such MCA, the input/output circuit section IOC_Ak (where k is any one of 0 to m) for the first port and the input/output circuit section IOC_Bk for the second port are disposed adjacently in the X direction. Namely, in the X direction, each is disposed in the order of arrangement of IOC_A1, IOC_B1, IOC_A2, IOC_B2, . . . , or IOC_A1, IOC_B1, IOC_B2, IOC_A2, . . . , or the like.

Here, in the above case, for example, the bit lines BLA[0] to BLA[3], /BLA[0] to /BLA[3] coupled to IOC_A1 inevitably come to intersect with the bit lines BLB[0] to BLB[3], /BLB[0] to /BLB[3] coupled to IOC_B1 in at least a portion, as shown in FIG. 14. Then, in the above intersecting area ARA, the bit lines for the first port become close to the bit lines for the second port, by which a risk of the occurrence of interference therebetween arises. In order to cope therewith, as a second feature, this intersecting area is made to have a wiring layout as shown in FIGS. 16 and 17.

Figure 16:
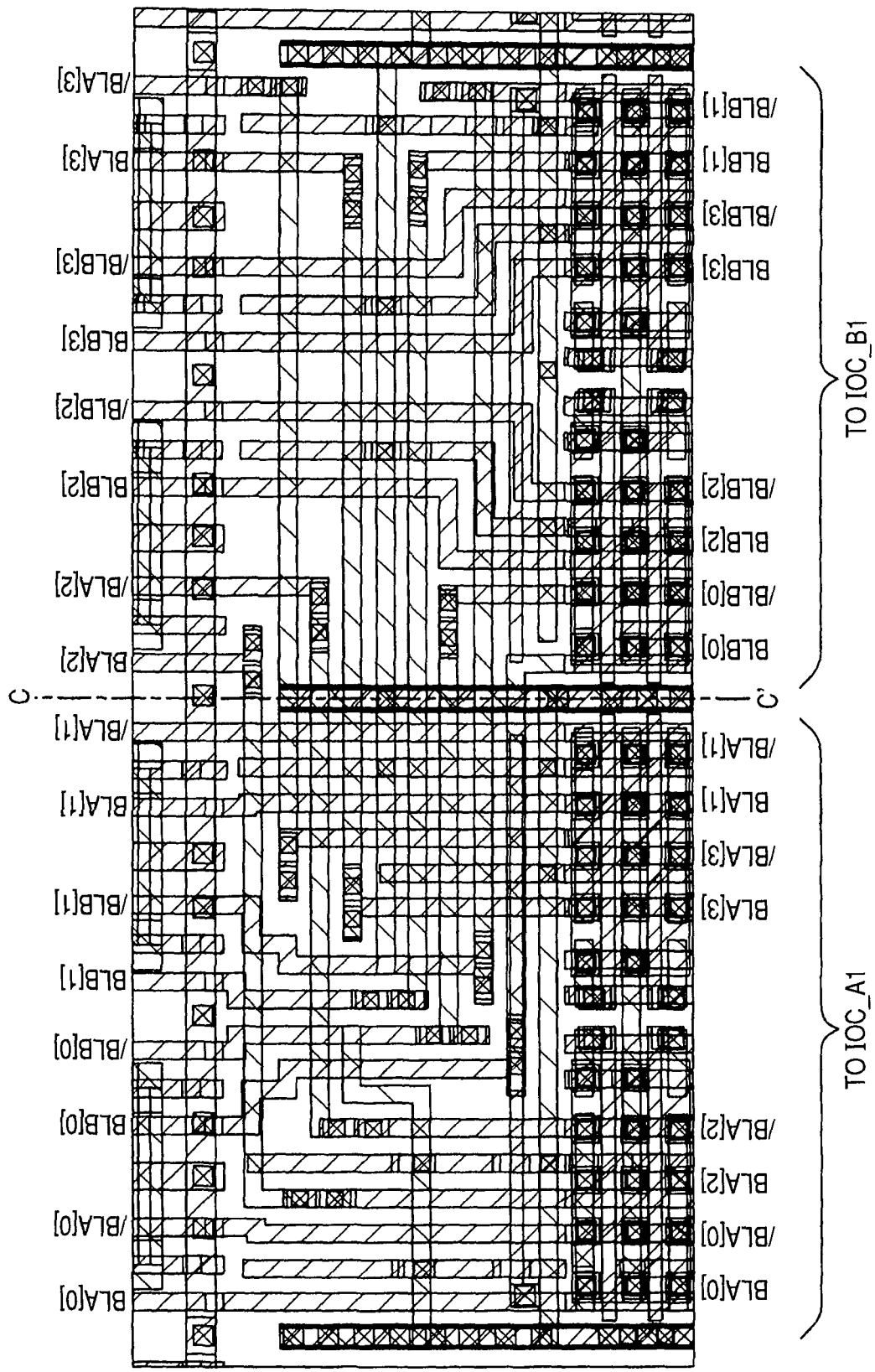
FIG. 16 shows a plan view illustrating one example of a wiring layout between a bit line and an input/output circuit sections in the semiconductor device shown in FIG. 14.
Figure 17:
FIG. 17 shows a sectional view illustrating an exemplary C-C' configuration shown in FIG. 16.

FIG. 16 shows a plan view illustrating one example of a wiring layout between the bit lines and the input/output circuit sections in the semiconductor device shown in FIG. 14. FIG. 17 shows a sectional view illustrating an exemplary configuration between C-C' shown in FIG. 16. The exemplary layout configuration shown in FIG. 16 corresponds to the area portion ARA shown in FIG. 14. Here, in FIG. 14, the order of arrangement of the bit lines in each memory cell MC is shown by the order of BLA, BLB, /BLA, and /BLB for the sake of convenience. However, in the case that the exemplary layout configuration as shown in FIG. 6 is applied, the arrangement of the bit lines becomes in the order of BLA, /BLA, BLB, and /BLB. In FIG. 16, based on an assumed case of applying to the memory cell MC the exemplary layout configuration as shown in FIG. 6, there is shown the wiring layout of the portion of the area ARA in such case, which is different to a certain extent from the wiring route shown in the area ARA of FIG. 14.

In FIG. 16, in the upper portion thereof, the bit lines are disposed in the order of BLA[0], /BLA[0], BLB[0], /BLB[0], BLB[1], /BLB[1], BLA[1], /BLA[1], . . . BLA[3], and /BLA[3]. Namely, bit lines (/BLB[0] and BLB[1], for example) disposed on both sides across the boundary line between mutually adjacent columns become bit lines belonging to an identical port. With this, it becomes possible to reduce interference between different ports, as compared with the case of disposing in such a manner that the bit lines on the both sides across the boundary line become the bit lines belonging to different ports. On the other hand, in the lower portion of FIG. 16, bit lines to be input to IOC_A1 are disposed in the order of BLA[0], /BLA[0], BLA[2], /BLA[2], BLA[3], /BLA[3], BLA[1] and /BLA[1], and in the neighbor thereof, bit lines to be input to IOC_B1 are respectively disposed in the similar order.

Accordingly, in order to couple the upper portion of FIG. 16 to the lower portion, it is necessary to draw BLA[2], /BLA[2], BLA[3] and /BLA[3], which are positioned on the right side of the upper portion, to the left side of the lower portion by use of wiring extending in the X direction, and also to draw BLB[0], /BLB[0], BLB[1] and /BLB[1] positioned on the left side of the upper portion to the right side of the lower portion, by use of wiring extending in the X direction. When drawing the wiring in the X direction, for example, a wiring layout as shown in FIG. 17 is used. Namely, with the provision of the GND line (or VDD line) extending in the X direction, the bit lines (BLA[2], /BLA[2], BLA[3], /BLA[3]) corresponding to the first port are disposed on one of both sides sandwiching the GND line (or VDD line), and also the bit lines (BLB[0], /BLB[0], BLB[1], /BLB[1]) corresponding to the second port are disposed on the other.

With this, as can be understood from the description on each embodiment so far, it is possible to attain an expanded noise margin because interference between different ports can be reduced as compared with the case of alternately disposing BLA and BLB, for example, in the wiring of the X direction. Further, the expanded noise margin can be attained with a small area.

Further, for example in FIG. 14, the expansion of the noise margin can also be attained when the input/output circuit sections IOC_A1 to IOC_Am for the first port are disposed on one long side of MCA and also the input/output circuit sections IOC_B1 to IOC_Bm for the second port are disposed on the other side, because such the bit line intersection area as described earlier becomes unnecessary. However, in this case, it becomes necessary in the actual layout that the size of the entire input/output circuit sections IOC_A1 to IOC_Am in the X direction and the size of the entire input/output circuit sections IOC_B1 to IOC_Bm in the X direction are made substantially equal to the size of MCA in the X direction. This produces an extra space in the layout, and causes anxiety of inefficiency or increase of the circuit area. As compared therewith, as shown in FIG. 14, it is possible to attain efficiency of the circuit area by disposing both the input/output circuit sections for the first port and the input/output circuit sections for the second port on one long side of MCA.

Subsequently, a third feature point in the exemplary configuration shown in FIG. 14 is that the aforementioned first port control line YCA is disposed on one of both sides sandwiching the shield line SLD, such as the GND line or the VDD line, and that the second port control line YCB is disposed on the other side. Namely, on the both ends of the plurality of input/output circuit sections IOC_A1 to IOC_Am and the input/output circuit sections IOC_B1 to IOC_Bm being disposed in the X direction, the controller CTLA of the first port is disposed adjacent to one end portion thereof, and the controller CTLB of the second port is disposed adjacent to the other end portion. Further, the first port control line YCA extends in the X direction from CTLA, crossing over the plurality of input/output circuit sections, and also the second port control line YCB extends in the X direction from CTLB, crossing over the plurality of input/output circuit sections. The shield line SLD extending in the X direction is disposed between the above YCA and YCB.

Since interference between different ports can be reduced by the above-mentioned dispositions of the first port control line YCA, the second port control line YCB and the shield line SLD, it is possible to attain an expanded noise margin. Also, the expansion of the noise margin can be attained with a small area.

Additionally, the first to the third feature points described in the present embodiment 3 are useful as a method for expanding a noise margin or expanding the noise margin with a small area when being used individually, needless to say. Moreover, it becomes more useful when being used in combination thereof. Also, needless to say, a further desirable effect may be obtained when being combined with the exemplary configurations as described in the embodiment 1 and the embodiment 2.

Further, in regard to the features of the second and the third points, the expansion of the noise margin has been attained by inserting the shield lines SLD between the bit lines (BLA-BLB) of different ports and between the control lines (YCA-YCB) of different ports, respectively, and however, it is also possible to expand the noise margin based on the relationship of magnitude of the pitches, similar to the case of the embodiment 1. Namely, in FIG. 17, it becomes possible to expand the noise margin without any shield line SLD if, for example, the pitch between BLA[3] and BLB[1], which belong to different ports, is made larger than the pitch between BLA[2] and /BLA[3] which belong to an identical port. Also, in FIG. 14, it becomes possible to expand the noise margin without any shield line SLD if the pitch between the first port control line YCA and the second port control line YCB is made larger than the pitch between each wiring included in the first port control line YCA.

Embodiment 4

Figure 18:
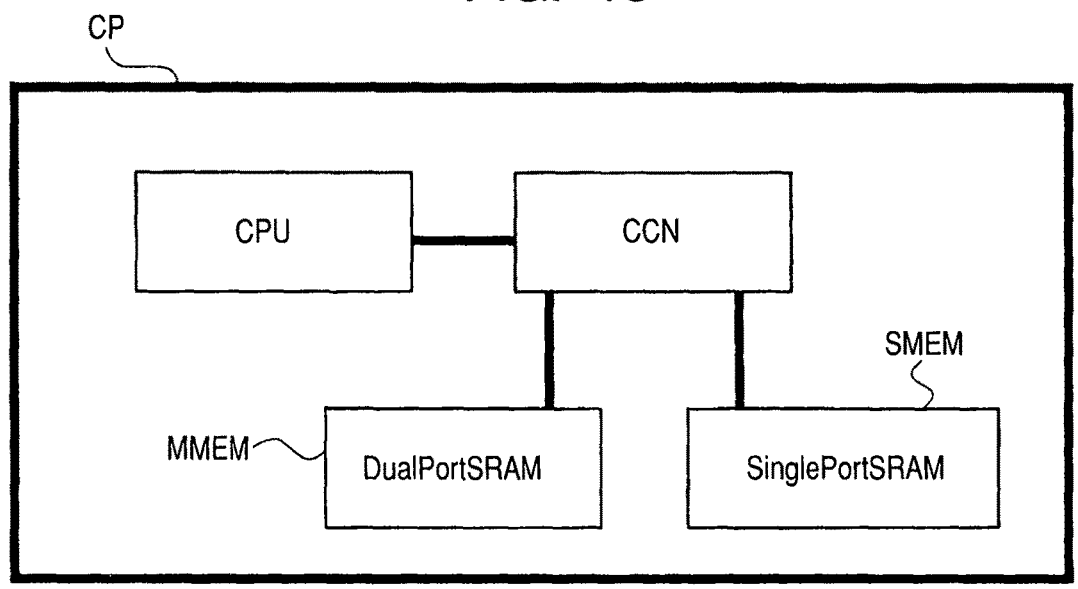
FIG. 18 shows a block diagram illustrating one exemplary configuration of a semiconductor device according to an embodiment 4 of the present invention.

FIG. 18 shows a block diagram illustrating one exemplary configuration of a semiconductor device according to an embodiment 4 of the present invention. The semiconductor device shown in FIG. 18 is formed of one semiconductor chip CP. Inside thereof, there are formed CPU (Central Processing Unit), single port memory SMEM, multiport memory MMEM, and cache controller CCN for controlling SMEM and MMEM by a CPU instruction, etc. The above multiport memory MMEM has the exemplary configuration as described in the embodiments 1 to 3.

On the other hand, the single port memory SMEM has a generally known SRAM configuration. Namely, SMEM includes a plurality of word lines juxtaposed with one another at an equal pitch, a plurality of bit lines juxtaposed with one another and extending in a direction orthogonal to the extension direction of the above plurality of word lines, and a plurality of memory cells disposed at the respective intersections between the above plurality of word lines and the plurality of bit lines.

Figure 19:
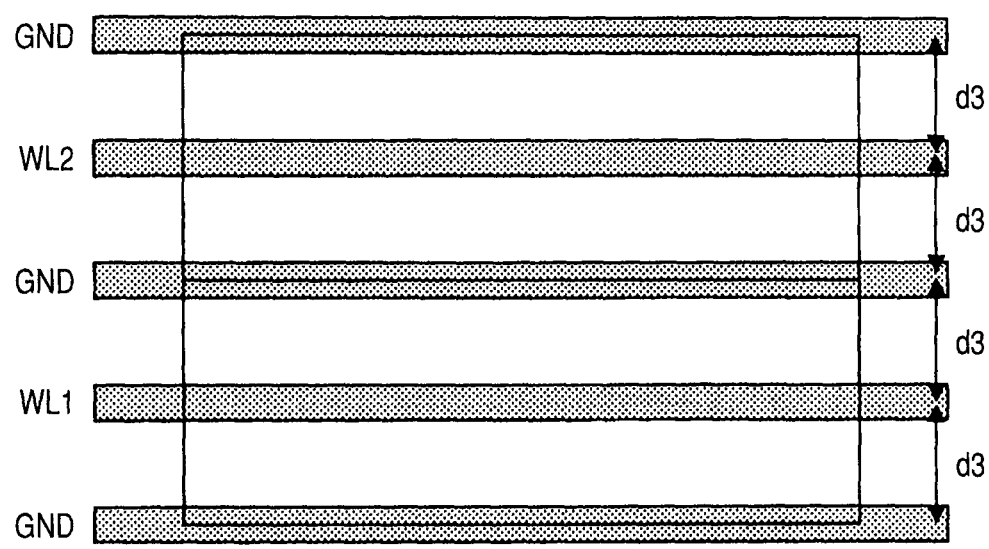
FIG. 19 shows a plan view illustrating an exemplary layout configuration of the word lines of a single port memory in the semiconductor device shown in FIG. 18.

FIG. 19 shows a plan view illustrating an exemplary layout configuration of the word lines of a single port memory in the semiconductor device shown in FIG. 18. As shown in FIG. 19, for example, the single port memory SMEM has a configuration such that a plurality of word lines WL1, WL2, . . . is disposed side by side, with the disposition of the GND line etc. between the respective word lines. The pitch between the respective word lines WL and the GND line on the both sides thereof has a value d3 which is equal over the entire single port memory. Also, the pitch between each of the plurality of word lines has a value (2×d2) which is equal over the entire single port memory. Namely, the plurality of wirings arranged in the row direction is arranged at equal intervals, respectively. On the other hand, in the multiport memory MMEM, as shown in FIG. 7 etc. for example, there may be cases that the plurality of wirings arranged in the row direction is not arranged at equal intervals. Further, in regard to the pitch between the respective word lines, the pitch d1 related to mutually different ports becomes larger than the pitch d2 related to a mutually identical port.

For the semiconductor device as shown in FIG. 18, miniaturization and high-speed operation are strongly required. In particular, in a multiport memory MMEM for use in a cache memory, there are cases that high-speed and complicated memory access is executed from CCN to a plurality of ports. Then, it becomes more and more important to secure a noise margin. In such cases, applying the exemplary configuration according to the present embodiments can sufficiently contribute to miniaturization and high-speed operation.

The invention made by the present inventor has been described typically based on the embodiments. However, the present invention is not limited to the aforementioned embodiments, and a variety of modifications are possible without deviating from the scope thereof.

For example, the multiport memory including the SRAM memory cell has been exemplified here, and however, it is also possible to apply to a multiport memory including a DRAM memory cell. It may also be possible to appropriately combine a portion or the entire of each embodiment.

The semiconductor device according to the present invention is a useful technique particularly when applied to a semiconductor device including a multiport memory constituted of an SRAM memory cell, and further, not limited thereto, the semiconductor device is widely applicable to general semiconductor devices including the multiport memory.

What is claimed is:

1. A semiconductor device comprising:
   first and second static memory cells, first, second, third and fourth word lines,
   and first and second pairs of bit lines,
   wherein each of the first and second static memory cells includes a first inverter and a second inverter, a first access transistor and a second access transistor coupled to the first inverter, and a third access transistor and a fourth access transistor coupled to the second inverter, wherein the first inverter has a first driver transistor and a first load transistor, and the second inverter has a second driver transistor and a second load transistor, wherein the first word line is electrically coupled to the first and third access transistors of the first static memory cell, the second word line is electrically coupled to the second and fourth access transistors of the first static memory cell, the third word line is electrically coupled to the second and fourth access transistors of the second static memory cell, and the fourth word line is electrically coupled to the first and third access transistors of the second static memory cell, wherein one of the first pair of bit lines is electrically coupled to the first access transistor of each of the first and second static memory cells, the other of the first pair of bit lines is electrically coupled to the third access transistor of each of the first and second static memory cells, and one of the second pair of bit lines is electrically coupled to the second access transistor of each of the first and second static memory cells, and the other of the second pair of bit lines is electrically coupled to the fourth access transistor of each of the first and second static memory cells, wherein the first and third access transistors and the first driver transistor of each of the first and second static memory cells are disposed in a first well of a first conductive type, wherein the first and the second load transistors of the first and second static memory cells are disposed in a second well of a second conductive type, wherein the second and fourth access transistors and the second driver transistor of each of the first and second static memory cells are disposed in a third well of the first conductive type, wherein the first, second and third wells are arranged in a first direction such that the second well is arranged between the first well and the third well, wherein the first and second static memory cells are arranged adjacently to each other, wherein the first and second pairs of bit lines extend along a first direction, wherein the first, second, third and fourth word lines extend along a second direction perpendicular to the first direction and are arranged over the first and second pairs of bit lines, wherein the second word line and the third word line are arranged between the first word line and the fourth word line such that the second word line and the third word line are arranged adjacently, and wherein a first distance between the first word line and the second word line is longer than a second distance between the second word line and third word line.

2. The semiconductor device according to claim 1, further comprising:

first and second port word driver circuits, wherein the first word line and the fourth word line are connected to the first port word driver circuit, and the second word line and the third word line are connected to the second port word driver circuit.

3. The semiconductor device according to claim 2, wherein the first port word driver circuit is arranged opposite to the second port word driver circuit via a memory array including the first and second static memory cells.

4. The semiconductor device according to claim 3, wherein a third distance between the third word line and the fourth word line is longer than the second distance between the second word line and third word line.

5. The semiconductor device according to claim 4, wherein the first and second driver transistors of the first and second static memory cells are coupled with a first power voltage wiring, wherein the first and second load transistors of the first and second static memory cells are coupled with a second power voltage wiring, and wherein the first and second power voltage wirings arranged in a same layer as the first and second pairs of bit lines.

6. The semiconductor device according to claim 3, wherein each of the first, second, third and fourth access transistors and the first and the second load transistors of the first memory cell is formed on a plurality of a substantively rectangular active regions being long in the first direction, respectively.

7. The semiconductor device according to claim 2, wherein the first static memory cell is arranged between the first word line and the second word line, and wherein the second static memory cell is arranged between the third word line and the fourth word line.

8. The semiconductor device according to claim 7, wherein each of the first, second, third and fourth access transistors and the first and the second load transistors of the second memory cell is formed on a plurality of a substantively rectangular active regions being long in the first direction, respectively.

* * * * *